(12) United States Patent
Saido et al.

(10) Patent No.: US 9,365,928 B2
(45) Date of Patent: Jun. 14, 2016

(54) SUBSTRATE PROCESSING APPARATUS, METHOD FOR MANUFACTURING SEMICONDUCTOR DEVICE AND COMPUTER-READABLE RECORDING MEDIUM

(71) Applicant: HITACHI KOKUSAI ELECTRIC INC., Tokyo (JP)

(72) Inventors: Shuhei Saido, Toyama (JP); Yuichi Wada, Toyama (JP); Takafumi Sasaki, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/680,587

(22) Filed: Apr. 7, 2015

(65) Prior Publication Data

US 2015/0307988 A1    Oct. 29, 2015

(30) Foreign Application Priority Data

Apr. 24, 2014   (JP) ................................. 2014-090479

(51) Int. Cl.
| | | |
|---|---|---|
| *C23C 16/44* | (2006.01) | |
| *H01L 21/677* | (2006.01) | |
| *C23C 16/455* | (2006.01) | |
| *C23C 16/458* | (2006.01) | |

(52) U.S. Cl.
CPC ......... *C23C 16/4412* (2013.01); *C23C 16/4583* (2013.01); *C23C 16/45551* (2013.01); *H01L 21/6776* (2013.01)

(58) Field of Classification Search
CPC .. C23C 16/455; C23C 16/4412; C23C 16/458
See application file for complete search history.

(56) References Cited

U.S. PATENT DOCUMENTS

| | | | |
|---|---|---|---|
| 8,944,347 B2* | 2/2015 | Huang | C23C 16/45551 239/291 |
| 2004/0067641 A1* | 4/2004 | Yudovsky | C23C 16/4412 438/680 |
| 2005/0103265 A1* | 5/2005 | Gianoulakis | C23C 16/4412 118/715 |
| 2008/0096369 A1 | 4/2008 | Strzyzewski et al. | |
| 2008/0115892 A1 | 5/2008 | Takeuchi et al. | |
| 2008/0261412 A1 | 10/2008 | Yoon et al. | |

(Continued)

FOREIGN PATENT DOCUMENTS

| | | |
|---|---|---|
| DE | 102004015216 A1 | 10/2005 |
| JP | 2007-035294 A | 2/2007 |

(Continued)

OTHER PUBLICATIONS

Jan. 28, 2015 Office Action issued in Japanese Application No. 2014-090479.

(Continued)

*Primary Examiner* — William Coleman
(74) *Attorney, Agent, or Firm* — Oliff PLC

(57) ABSTRACT

A substrate processing apparatus includes: a substrate mounting table on which a substrate is mounted; an inert gas supply part configured to supply an inert gas on a surface of the substrate from an upper side of the substrate mounting table at a lateral side of the processing gas supply part; and a plurality of gas exhaust parts configured to exhaust a gas supplied on the surface of the substrate to an upper side, between the processing gas supply part and the inert gas supply part.

18 Claims, 14 Drawing Sheets

(56) References Cited

U.S. PATENT DOCUMENTS

| | | |
|---|---|---|
| 2009/0304924 A1 | 12/2009 | Gadgil |
| 2011/0097493 A1* | 4/2011 | Kerr .................. C23C 16/455 427/255.5 |
| 2011/0212625 A1 | 9/2011 | Toyoda et al. |
| 2012/0003396 A1 | 1/2012 | Maas et al. |
| 2012/0222620 A1 | 9/2012 | Yudovsky |
| 2012/0225191 A1 | 9/2012 | Yudovsky et al. |
| 2012/0225193 A1 | 9/2012 | Yudovsky |
| 2012/0225195 A1 | 9/2012 | Yudovsky |
| 2013/0001330 A1 | 1/2013 | Huang |
| 2013/0210238 A1 | 8/2013 | Yudovsky |

FOREIGN PATENT DOCUMENTS

| | | |
|---|---|---|
| JP | 2008-509547 A | 3/2008 |
| JP | 2009-531535 A | 9/2009 |
| JP | 2009-259989 A | 11/2009 |
| JP | 2010-103188 A | 5/2010 |
| JP | 2010-525162 A | 7/2010 |
| JP | 2011-222960 A | 11/2011 |
| JP | 2012-501537 A | 1/2012 |

OTHER PUBLICATIONS

Sep. 25, 2015 Office Action issued in Korean Application No. 10-2014-0067438.

Jun. 2, 2015 Office Action issued in Japanese Application No. 2014-090479.

Mar. 28, 2016 Office Action issued in Korean Application No. 10-2014-0067438.

* cited by examiner

SUBSTRATE PROCESSING APPARATUS, METHOD FOR MANUFACTURING SEMICONDUCTOR DEVICE AND COMPUTER-READABLE RECORDING MEDIUM

BACKGROUND

1. Technical Field

The present invention relates to a substrate processing apparatus, a method for manufacturing a semiconductor device and a non-transitory computer-readable recording medium.

2. Description of Related Art

Generally, a substrate processing apparatus used for applying processing such as film formation processing to a wafer, etc., is used in a manufacturing step of a semiconductor device. As a processing performed by a single wafer processing type substrate processing apparatus, for example cyclic processing can be given, which is the processing of alternately supplying a plurality of processing gases. In this cyclic processing, film formation is performed on a substrate by setting a source gas supplying step, a purging step, a reactant gas supplying step, and a purging step as one cycle, and repeating this cycle for a specific number of times (n-cycle).

A single wafer processing-type apparatus for processing substrates one by one, is known as the substrate processing apparatus. For example, such a single wafer processing-type apparatus includes the one configured to supply each kind of gas (for example, a source gas, reactant gas, or purge gas) on a surface of a substrate to be processed from its upper side, and exhaust each kind of the gas supplied to the surface of the substrate to the upper side of the substrate.

In the substrate processing apparatus configured to supply and exhaust a gas from the upper side of the substrate, for example if a vapor phase reaction occurs between a source gas and a reactant gas, a desired processing cannot be performed on the substrate. Further, for example if the source gas or the reactant gas, and a purge gas (inert gas) are mixed, dilution of the source gas or the reactant gas occurs. Therefore, it is important to supply each kind of the gas to the surface of the substrate in a state of not being mixed but being separated, for realizing an appropriate processing.

An object of the present invention is to provide a substrate processing apparatus, a method for manufacturing a semiconductor device and a non-transitory computer readable recording medium capable of appropriately applying processing to a substrate, when each kind of gas is supplied/exhaust toward the upper side.

SUMMARY OF THE INVENTION

According to an aspect of the present invention, there is provided a substrate processing apparatus, including:

a substrate mounting table on which a substrate is mounted;

a processing gas supply part configured to supply a processing gas on a surface of the substrate from an upper side of the substrate mounting table;

an inert gas supply part configured to supply an inert gas on a surface of the substrate from an upper side of the substrate mounting table at a lateral side of the processing gas supply part; and a plurality of gas exhaust parts configured to exhaust the gas supplied on the surface of the substrate to an upper side, between the processing gas supply part and the inert gas supply part.

According to other aspect of the present invention, there is provided a substrate processing apparatus, including:

a substrate mounting table on which a substrate is mounted;

an inert gas supply part configured to supply an inert gas on a surface of the substrate from an upper side of the substrate mounting table at a lateral side of the processing gas supply part; and a gas exhaust parts configured to exhaust a gas supplied on the surface of the substrate to an upper side, between the processing gas supply part and the inert gas supply part, wherein a lower surface of the inert gas supply part is disposed more closely to the substrate than a lower surface of the processing gas supply part.

According to other aspect of the present invention, there is provided a method for manufacturing a semiconductor device, including:

supplying a processing gas on a surface of a substrate mounted on a substrate mounting table from a processing gas supply part positioned at an upper side of the substrate mounting table;

supplying an inert gas on the surface of the substrate from an inert gas supply part disposed at a lateral side of the processing gas supply part and positioned at the upper side of the substrate mounting table;

exhausting a processing gas supplied on the surface of the substrate to the upper side of the substrate by at least a part of the plurality of gas exhaust parts disposed between the processing gas supply part and the inert gas supply part; and exhausting an inert gas supplied on the surface of the substrate by at least other part of the plurality of gas exhaust parts.

According to other aspect of the present invention, there is provided a non-transitory computer readable recording medium storing a program for causing a computer to execute in parallel:

a processing gas supply procedure of supplying a processing gas on a surface of a substrate mounted on a substrate mounting table from a processing gas supply part positioned at an upper side of the substrate mounting table;

an inert gas supply procedure of supplying an inert gas on the surface of the substrate from an inert gas supply part disposed at a lateral side of the processing gas supply part and positioned at the upper side of the substrate mounting table;

a processing gas exhaust procedure of exhausting a processing gas supplied on the surface of the substrate to the upper side of the substrate by at least a part of the plurality of gas exhaust parts disposed between the processing gas supply part and the inert gas supply part; and an inert gas exhaust procedure of exhausting an inert gas supplied on the surface of the substrate by at least other part of the plurality of gas exhaust parts.

According to the present invention, processing can be appropriately applied to a substrate when each kind of gas is supplied/exhaust toward the upper side.

DETAILED DESCRIPTION OF THE INVENTION

<First Embodiment of the Present Invention>

A first embodiment of the present invention will be described hereafter, with reference to the drawings.

(1) Structure of a Substrate Processing Apparatus according to a First Embodiment A substrate processing of this embodiment is configured as a single wafer processing-type substrate processing apparatus for applying processing to a substrate to be processed one by one.

A semiconductor wafer substrate (simply called a "wafer" hereafter) with a semiconductor device built therein can be given as a substrate to be processed.

Etching, ashing, and film formation processing, etc., can be given as the processing applied to the substrate. However, the processing of this embodiment is particularly the film formation processing.

Figure 1:
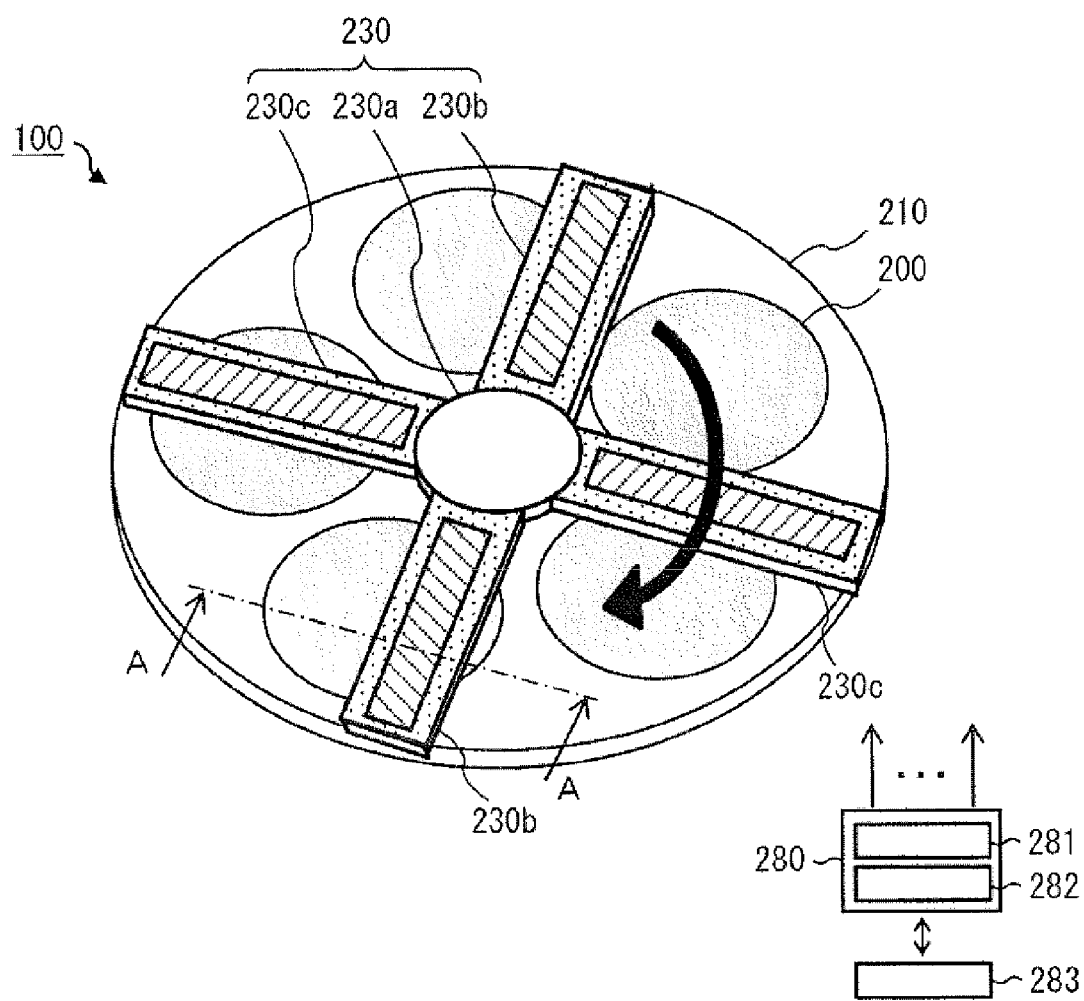
FIG. 1 is a conceptual view showing a schematic block diagram of an essential part of a substrate processing apparatus according to an embodiment of the present invention.

FIG. 1 is a conceptual view showing a schematic block diagram of an essential part of a substrate processing apparatus according to an embodiment of the present invention.
(Processing Vessel)

A substrate processing apparatus 100 includes a processing vessel not shown. The processing vessel is configured as a sealed vessel made of a metal material such as aluminum (Al) and stainless (SUS), etc. A substrate loading outlet not shown is provided on a side face of the processing vessel, so that a wafer 200 is transported through this substrate loading outlet. Further, the processing vessel is connected thereto a gas exhaust system such as a vacuum pump and a pressure control unit, etc., not shown, so that a pressure in the processing vessel is adjusted to a specific pressure using the gas exhaust system.
(Substrate Mounting Table)

A substrate mounting table 210 on which a wafer 200 is mounted, is provided in the processing vessel. The substrate mounting table 210 is formed into a disc shape for example, and is configured so that a plurality of wafers 200 are mounted on its upper surface (substrate mounting surface) at the same interval in a circumferential direction. Further, the substrate mounting table 210 includes a heater not shown as a heating source, and is configured to maintain a temperature of the wafer 200 to a specific temperature using the heater. The figure shows an example of a case that five wafers 200 are mounted. However, the present invention is not limited thereto, and the number of wafers to be mounted may be suitably set. For example, if the number of wafers to be mounted is large, improvement of a processing throughput can be expected, and if the number of wafers to be mounted is small, increase in size of the substrate mounting table 210 can be suppressed. The substrate mounting surface of the substrate mounting table 210 is directly brought into contact with the wafer 200. Therefore, the substrate mounting surface is preferably made of a material such as quartz or alumina, etc.
(Cartridge Head)

A cartridge head 230 as a gas supplying mechanism of supplying a gas to the wafer 200 on the substrate mounting table, is provided on an upper side of the substrate mounting table 210. The cartridge head 230 is configured including a central supporting part 230a disposed near a central position of the substrate mounting table 210, and a plurality of cartridge parts 230b, 230c extending radially toward an outer peripheral side of the substrate mounting table 210 from the central supporting part 230a. The cartridge parts 230b and 230c are respectively extended to an outer peripheral side of the wafer 200, beyond the outer peripheral edge of the wafer 200 on the substrate mounting table 210.

As described later in detail, the cartridge parts 230b and 230c are respectively configured having a processing gas supply part 232, an inert gas supply part 234, and gas exhaust parts 236a and 236b respectively. Then, by supplying a processing gas on the surface of the wafer 200 mainly by the processing gas supply part 232, the cartridge parts 230b and 230c respectively function as a gas supplying mechanism of supplying a gas to the wafer 200. In the first embodiment, different kinds of processing gases (for example, source gas and reactant gas) are supplied by the processing gas supply part 232 in a part of the cartridge part 230b and the other cartridge part 230c which are provided in each one of the cartridge parts 230b and 230c.

The figure shows a case that the setting number of the cartridge parts 230b and 230c respectively is four in total equally in the circumferential direction, with the central supporting part 230a as a center. However, the present invention is not limited thereto, and the setting number of each of the cartridge parts 230b and 230c may be suitably set in consideration of the number of gas species supplied to the wafer 200 and the processing throughput, etc. For example, when the source gas and the reactant gas are supplied as the processing gas, at least two cartridge parts 230b and 230c in total may be provided, and a larger setting number is preferable for improving the processing throughput.

Further, in the first embodiment, each one of the cartridge parts 230b and 230c is configured to extend in belt-shape toward the outer peripheral side of the substrate mounting table 210 from the central supporting part 230a. Namely, each one of the cartridge parts 230b and 230c has approximately a rectangular planar shape, longitudinally disposed toward the outer peripheral side of the substrate mounting table 210. However, the planar shape of each one of the cartridge parts 230b and 230c is not necessarily required to be approximately the rectangular shape. For example, the planar shape of each one of the cartridge parts 230b and 230c may be a fan-shape spreading toward the outer peripheral side, in consideration of a relation between a gas supply amount and a difference of circumferential speed in inner/outer circumference when the substrate mounting table 210 and the cartridge head 230 are relatively moved as described later. In any case of the planar shape, a longitudinal size of each one of the cartridge pats 230b and 230c is formed larger than a maximum diameter of the wafer 200.

A matching box and a RF generator not shown may be connected to the cartridge part 230c of each one of the cartridge parts 230b and 230c. In this case, plasma is generated in a lower side space of the cartridge part 230c by adjusting impedance by the RF generator and the matching box.

(Moving Mechanism)

As described above, the cartridge head 230 is configured to be rotary-driven by a moving mechanism not shown, with a central position of the substrate mounting table 210 (namely the central position of the central supporting part 230a, in other words, the center of the radially arranged cartridge 230) as a rotation axis. Namely, the cartridge parts 230b and 230c of the cartridge head 230 sequentially pass through the surface of each wafer 200 mounted on the substrate mounting table 210, by being rotary-driven by the moving mechanism. Thus, the relative position of the substrate mounting table 210, and the cartridge parts 230b and 230c of the cartridge head 230 is moved in a rotating direction by the moving mechanism.

The moving mechanism for rotary-driving the cartridge head 230 can be configured including a rotary bearing for rotatably supporting the central supporting part 230a, and a driving source, etc., typically such as an electric motor.

In the first embodiment, the moving mechanism is given as an example, for rotary-driving the cartridge head 230. However, the moving mechanism for rotating the substrate mounting table 210 is also acceptable, if the moving mechanism is configured to vary the relative position of the substrate mounting table 210, and the cartridge parts 230b and 230c of the cartridge head 230. By rotary-driving the cartridge head 230, moment of inertia that actions on the wafer 200 can be suppressed, and a rotation speed can be increased, compared with a case of rotary-driving the substrate mounting table 210. Further, by rotary-driving the substrate mounting table 210, complication of a structure of a gas piping, etc., described later can be suppressed, unlike the case of rotary-driving the cartridge head 230.

(Cartridge Part)

Here, the cartridge parts 230b and 230c of the cartridge head 230 will be further specifically described.

Figure 2:
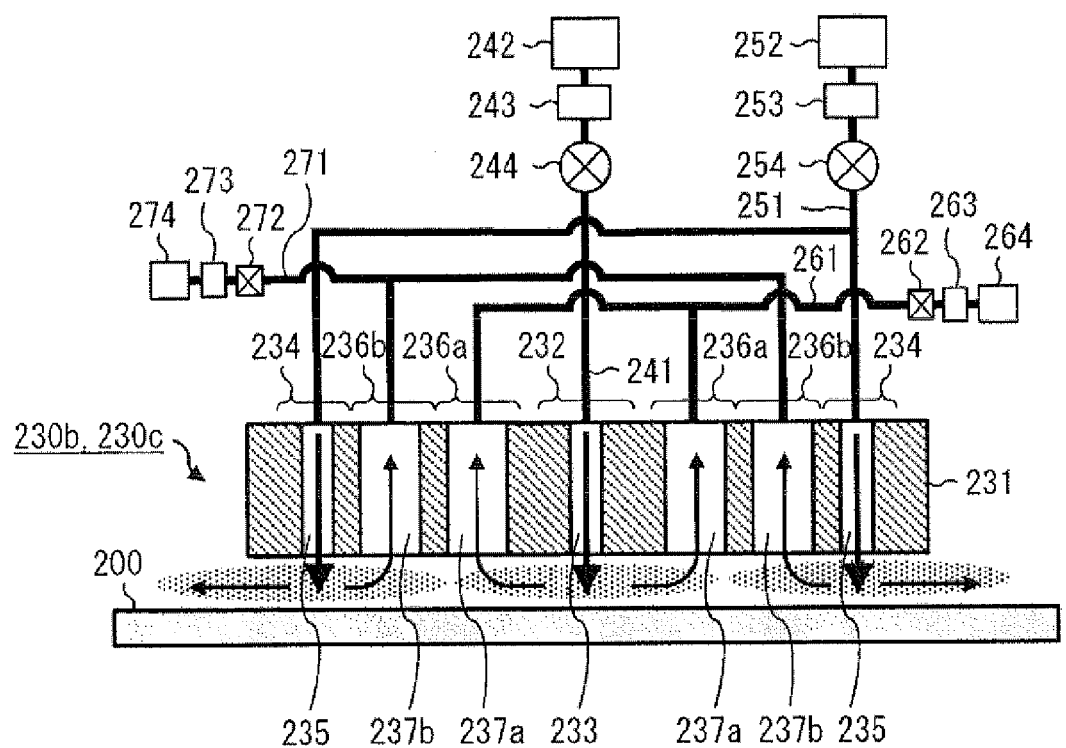
FIG. 2 is a view showing a detailed constitutional diagram of the essential part of the substrate processing apparatus according to the first embodiment of the present invention, and a cross-sectional view showing a cross-sectional face taken along the line A-A of FIG. 1.

FIG. 2 is a view showing a detailed constitutional diagram of an essential part of a substrate processing apparatus according to a first embodiment of the present invention, and a cross-sectional view showing a cross-sectional face taken along the line A-A of FIG. 1.

A cartridge structure will be described here, using the A-A cross-sectional face. However, each one of the cartridges 230b and 230c has a similar structure.

Each one of the cartridge parts 230b and 230c has the processing gas supply part 232. The processing gas supply part 232 is provided for supplying the processing gas on the wafer 200 from the upper side of the substrate mounting table 210, and is configured having a processing gas supply hole 233 being a through hole penetrating a cartridge base 231. It can be considered that the cartridge base 231 is made of a non-metal material to prevent a metal contamination of the wafer 200. However, as described later, it can also be considered that the cartridge base 231 is made of a conductive metal for responding to plasma-exciting the processing gas. The processing gas supplied by the processing gas supply part 232, is one of the source gas and the reactant gas as described later in detail.

Further, each one of the cartridge parts 230b and 230c respectively has an inert gas supply part 234 disposed at both sides of the processing gas supply part 232. The inert gas supply part 234 is provided for supplying an inert gas on the surface of the wafer 200 from the upper side of the substrate mounting table 210 at both sides of the processing gas supply part 232, and is configured to have an inert gas supply hole 235 being a through hole penetrating the cartridge base 231. The inert gas supplied by the inert gas supply part 234 will be described later in detail.

Further, each one of the cartridge parts 230b and 230c has gas exhaust parts 236a and 236b disposed between the processing gas supply part 232 and the inert gas supply part 234 at one side, and disposed between the processing gas supply part 232 and the inert gas supply part 234 at the other side. A plurality of gas exhaust parts 236a and 236b are disposed between the processing gas supply part 232 and the inert gas supply parts 234, which are disposed more closely to the processing gas supply part 232 than the inert gas supply part 234 between the processing gas supply part 232 and the inert gas supply parts 234, and disposed more closely to the inert gas supply part 234 than the processing gas supply part 232 between the processing gas supply part 232 and the inert gas supply parts 234, and include at least the inert gas exhaust part (second gas exhaust part) for exhausting mainly the inert gas from the inert gas supply part 234.

The processing gas exhaust parts 236a is disposed at both sides, with the processing gas supply part 232 interposed between them, and is configured including a processing gas exhaust hole 237a being a through hole on the cartridge base 231.

The inert gas exhaust part 236b is disposed so as to correspond to each inert gas supply part 234 at more outside of the cartridge than the processing gas exhaust part 236a, and is configured including an inert gas exhaust hole 237b being a through hole on the cartridge base 231.

FIG. 2 shows across-sectional face of the cartridge parts 230b and 230c respectively in a short direction in planar view. Therefore, in the figure, each one of the inert gas supply part 234, the processing gas exhaust part 236a, and the inert gas exhaust part 236b is respectively disposed at both sides of the processing gas supply part 232 with the processing gas supply part interposed between them. However, they can also be disposed so as to surround a circumference of the processing gas supply part 232 (namely, at every side surrounding the processing gas supply part 232 in planar view), if they are disposed at both sides of the processing gas supply part 232.

(Processing Gas Supply System)

A processing gas supply pipe 241 is connected to the processing gas supply hole 233 of the processing gas supply part 232. A processing gas supply source 242, a mass flow controller (MFC) 243 being a flow rate control unit (flow rate control part), and a valve 244 being an open/close valve, are provided on the processing gas supply pipe 241 sequentially from an upstream direction.

A processing gas supply system is constituted mainly by the processing gas supply pipe 241, MFC 243, and the valve 244. Also, the processing gas supply source 242 can be included in the processing gas supply system.

With this structure, the processing gas supply system supplies the processing gas on the wafer 200 from the upper side of the substrate mounting table 210 through the processing gas supply hole 233 of the processing gas supply part 232. The processing gas supplied by the processing gas supply system is the source gas in the cartridge part 230b and is the reactant gas in the cartridge part 230c.

The source gas is one of the processing gases, which is the source gas obtained by vaporizing $TiCl_4$ (Titanium Tetrachloride) being a metal liquid source containing Ti (titanium) for example (namely, the source gas is $TiCl_4$ gas). The source gas may be in any one of a solid state, a liquid state, and a gas state at normal temperature and normal pressure. When the source gas is in the liquid state at normal temperature and normal pressure, a vaporizer not shown may be provided between the first gas supply source 243b and the mass flow controller 243c. Here, explanation is given for a case that the source gas in the gas state.

The reactant gas is the other one of the processing gas, and for example ammonia ($NH_3$) gas is used.

A gas supply system not shown may be connected to the processing gas supply pipe 241 in the processing gas supply system, for supplying the inert gas that functions as a carrier gas of the source gas, or a carrier gas of the reactant gas, or a diluent gas. Specifically nitrogen ($N_2$) gas for example can be used as the inert gas that functions as the carrier gas, etc. Further for example a rare gas such as a helium (He) gas, a neon (Ne) gas, and an argon (Ar) gas may be used other than the $N_2$ gas.

(Inert Gas Supply System)

An inert gas supply pipe 251 is connected to an inert gas supply hole 235 of the inert gas supply part 234. An inert gas supply source 252, a mass flow controller (MFC) 253 being a flow rate control unit (flow rate control part), and a valve 254 being an open/close valve, are provided on the inert gas supply pipe 251 sequentially from the upstream direction.

An inert gas supply system is constituted mainly by the inert gas supply pipe 251, MFC 253, and the valve 254. The inert gas supply source 252 may be included in the inert gas supply system.

With this structure, the inert gas supply system supplies the inert gas on the wafer 200 from the upper side of the substrate mounting table 210 through the inert gas supply hole 235 of the inert gas supply part 234.

The inert gas functions as an air seal for sealing a space between an upper surface of the wafer 200 and a lower surface of the cartridge base 231. Specifically, for example $N_2$ gas can be used. Further for example a rare gas such as a helium (He) gas, a neon (Ne) gas, and an argon (Ar) gas may be used other than the $N_2$ gas.

(Processing Gas Exhaust System)

A processing gas exhaust pipe 261 is connected to the processing gas exhaust hole 237a of the processing gas exhaust part 236a. A valve 262 is provided on the processing gas exhaust pipe 261. Further, a pressure control unit 263 is provided on a downstream side of the valve 262 on the processing gas exhaust pipe 261, for controlling a pressure in a lower space of the processing gas supply hole 232 to a specific pressure. Further, a vacuum pump 264 is provided on a downstream side of the pressure control unit 263 on the processing gas exhaust pipe 261.

A processing gas exhaust system is constituted mainly by the processing gas exhaust pipe 261, the valve 262, the pressure control unit 263, and the vacuum pump 264.

With this structure, the processing gas exhaust system exhausts the processing gas supplied on the surface of the wafer 200 to the upper side of the wafer 200 by the processing gas supply part 232, through the processing gas exhaust hole 237a of the processing gas exhaust part 236a.

(Inert Gas Exhaust System)

An inert gas exhaust pipe 261 is connected to the inert gas exhaust hole 237b of the inert gas exhaust part 236b. A valve 272 is provided on the inert gas exhaust pipe 271. Further, a pressure control unit 273 is provided on a downstream side of the valve 272 on the inert gas exhaust piper 271, for controlling a pressure in a lower space of the inert gas supply part 234 to a specific pressure. Further, a vacuum pump 274 is provided on a downstream side of the pressure control unit 273 on the inert gas exhaust pipe 271.

An inert gas exhaust system is constituted mainly by the inert gas exhaust pipe 271, the valve 272, the pressure control unit 273, and the vacuum pump 274.

With this structure, the inert gas supplied on the surface of the wafer 200 by the inert gas supply part 234, is exhausted to the upper side of the wafer 200, through the inert gas exhaust hole 237b of the inert gas exhaust part 236b.

(Controller)

Further as shown in FIG. 1, the substrate processing apparatus 100 has a controller 280 for controlling an operation of each part of the substrate processing apparatus 100. The controller 280 has at least a calculation part 281 and a memory part 282. The controller 280 is connected to the abovementioned each structure, and retrieves a program or a recipe from the memory part 282 as needed under an instruction of a host controller or a user, and controls the operation of each structure according to the content of the program or the recipe. Specifically, the controller 280 controls the operation of a moving mechanism, a heater, an RF generator, a matching box, MFCs 243 and 253, valves 244 to 272, and vacuum pumps 264 and 274, etc.

The controller 280 may also be configured as a dedicated computer or may be configured as a general purpose computer. For example, an external memory device storing the abovementioned program (for example, magnetic tape, a magnetic disc such as a flexible disc and a hard disc, etc., an optical disc such as MO, and a semiconductor memory such as a USB memory and a memory card, etc.) 283 is prepared, and the program is installed on the general purpose computer using the external memory device 283, to thereby constitute the controller 280 of this embodiment.

Further, means for supplying the program to the computer is not limited to a supply through the external memory device 283. For example, the program may be supplied to the computer not through the external memory device 283, using a communication means such as Internet or dedicate lines, etc., for example. The memory part 282 and the external memory device 283 are configured as a non-transitory computer-readable recording medium. They are generally simply called a recording medium hereafter. In this specification, when using the term of recording medium, this is a case including the memory part 282 alone, a case including the external memory device 283 alone, or a case including both of them.

(2) Substrate Processing Step

The step of forming a thin film on the wafer 200 using the substrate processing apparatus 100 will be described next, as one step of the method for manufacturing a semiconductor device. In the explanation hereafter, the operation of each part constituting the substrate processing apparatus 100 is controlled by the controller 280.

Here, explanation is given for an example of forming a TiN film as a metal thin film on the wafer 200 using $TiCl_4$ gas obtained by vaporizing $TiCl_4$ as a source gas (first processing gas), and using $NH_3$ gas as a reactant gas (second processing gas), and alternately supplying these gases.

Figure 3:
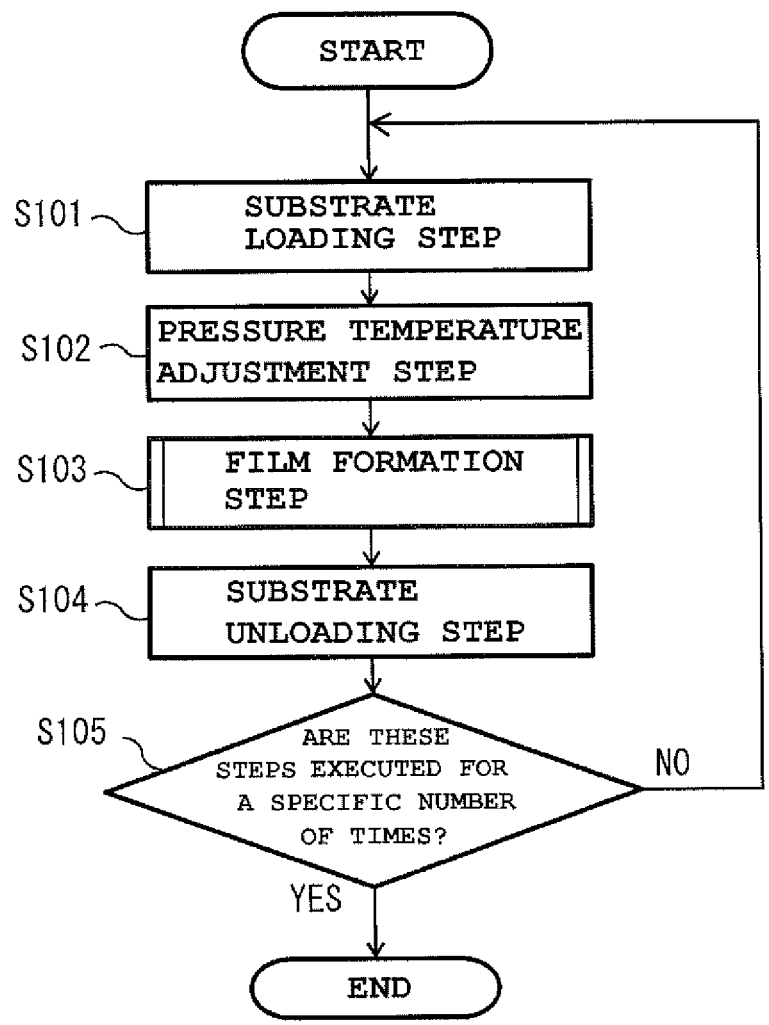
FIG. 3 is a flowchart showing a substrate processing step according to a first embodiment of the present invention.

FIG. 3 is a flowchart showing the substrate processing step according to a first embodiment of the present invention.

(Substrate Loading Step: S101)

In the substrate processing apparatus 100, first, the substrate loading outlet is opened in a substrate loading step (S101), to thereby load a plurality of (for example five) wafers 200 into a processing vessel using a wafer transfer machine not shown, and the wafers 200 are mounted on the substrate mounting table 210 in such a manner as being arranged thereon. Then, the wafer transfer machine is retreated to outside of the processing vessel, and the substrate loading outlet is closed to thereby seal the inside of the processing vessel.

(Pressure Temperature Adjustment Step: S102)

A pressure temperature adjustment step (S102) is performed subsequently to the substrate loading step (S101). In the pressure temperature adjustment step (S102), the gas exhaust system connected to the processing vessel is operated after the inside of the processing vessel is sealed, so that the pressure in the processing vessel is set to a specific pressure. The specific pressure is a processing pressure capable of forming the TiN film in the film formation step (S103) described later, which is the processing pressure of not allowing a self-decomposition to occur in the source gas supplied to the wafer 200 for example. Specifically, the processing pressure can be 50 to 5000 Pa, and is maintained as it is in the film formation step (S103) described later.

Further, in the pressure temperature adjustment step (S102), electric power is supplied to the heater embedded in the substrate mounting table 210, and the temperature of the surface of the wafer 200 is controlled to a specific temperature. At this time, the temperature of the heater is adjusted by controlling a power supply state to the heater based on temperature information detected by a temperature sensor not shown. The specific temperature is the processing temperature capable of forming the TiN film in the film formation step (S103) described later, which is the processing temperature of not allowing the self-decomposition to occur in the source gas supplied to the wafer 200 for example. Specifically, the processing temperature can be a room temperature or more and 500° C. or less, and preferably a room temperature or more and 400° C. or less. The processing temperature is maintained in the film formation step (S103) described later.

(Film Formation Step: S103)

The film formation step (S103) is performed subsequently to the pressure temperature adjustment step (S102). A processing operation performed in the film formation step (S103) is roughly divided into a processing operation of varying the relative position and a gas supply/exhaust processing operation.

(Processing Operation of Varying the Relative Position)

Here, the processing operation of varying the relative position will be described first.

Figure 4:
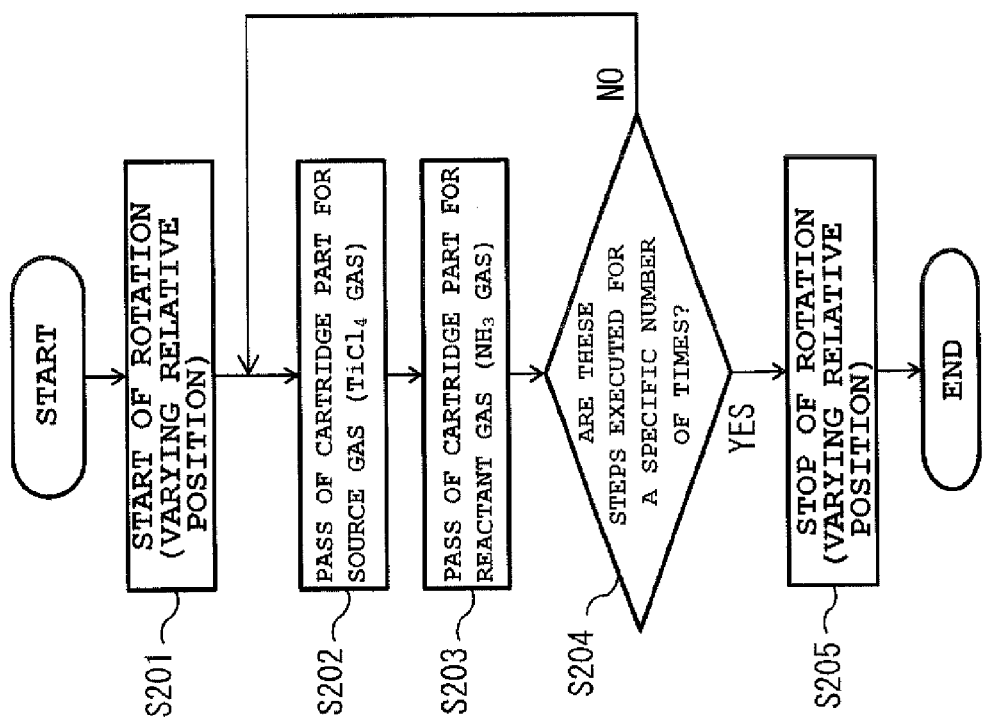
FIG. 4 is a flowchart showing a detail of a processing operation of varying the relative position performed in a film formation step of FIG. 3.

FIG. 4 is a flowchart showing a detail of the processing operation of varying the relative position performed in the film formation step of FIG. 3.

In the substrate processing apparatus 100, first, varying the relative position of the substrate mounting table 210 and the cartridge parts 230b, 230c of the cartridge head 230, is started by rotary-driving the cartridge head 230 by the moving mechanism (S201). Thus, each one of the cartridge parts 230b and 230c of the cartridge head 230 sequentially passes through the surface of each wafer 200 mounted on the substrate mounting table 210.

Further, in the substrate processing apparatus 100, a gas supply/exhaust processing operation is started, which will be described in detail later. Thus, the source gas ($TiCl_4$ gas) is supplied from the cartridge part 230b of the cartridge head 230, and the reactant gas ($NH_3$ gas) is supplied from the cartridge part 230c of the cartridge head 230. The cartridge part 230b for supplying the source gas is called a "source gas cartridge part for source gas", and the cartridge part 230c for supplying the reactant gas is called a "cartridge part for reactant gas" hereafter.

When a certain wafer 200 is focused here, the cartridge part 230b for source gas passes through the surface of the wafer 200 by start of varying the relative position by the moving mechanism (S202). At this time, the source gas ($TiCl_4$ gas) is supplied on the surface of the wafer 200 from the cartridge part 230b for source gas. Further, the pressure and the temperature of a space on a surface of the wafer 200 are adjusted to the processing pressure and the processing temperature of not allowing the self-decomposition to occur in the source gas. Therefore, gas molecules of the source gas are adsorbed on the surface of the wafer 200. Note that the time required for the source gas cartridge part 230b to pass through the surface of the wafer 200, namely the time required for supplying the source gas, is adjusted to 0.1 to 20 seconds for example.

After the source gas cartridge part 230b passes through the surface of the wafer 200, the reactant gas cartridge part 230c subsequently passes through the surface of the wafer 200 (S203). At this time, the reactant gas ($NH_3$ gas) is supplied on the surface of the wafer 200 from the reactant gas cartridge part 230c. Further, plasma is generated in a lower side space of the reactant gas cartridge part 230c, using the matching box and the RF generator not shown. The reactant gas in plasma state is uniformly supplied on the surface of the wafer 200 by passing of the reactant gas cartridge part 230c, and is reacted with the gas molecules of the source gas adsorbed on the wafer 200, to thereby generate the TiN film of about less than one atomic layer (less than 1 Å) on the wafer 200. Note that the time required for the source gas cartridge part 230b to pass through the surface of the wafer 200, namely the time required for supplying the source gas, is adjusted to 0.1 to 20 seconds for example.

The abovementioned passing operation of the cartridge part 230b for source gas and passing operation of the cartridge part 230c for reactant gas are set as one cycle, and the controller 280 judges whether or not this cycle is executed for a specific number of times (n-cycle) (S204). When this cycle is executed for a specific number of times, a titanium nitride (TIN) film having a desired film thickness is formed on the wafer 200. Namely, in the film formation step (S103), a cyclic processing operation of repeating the step of alternately supplying different processing gases is performed, by performing the processing operation of varying the relative position. Further, in the film formation step (S103), the TIN film is simultaneously parallelly formed on each wafer 200 mounted on the substrate mounting table 210, by performing the cyclic processing operation to each wafer 200.

Then, when the specific number of times of cyclic processing operation is ended, the moving mechanism stops varying the relative position of the substrate mounting table 210, and each one of the cartridge parts 230b and 230c of the cartridge head 230 8S205). Thus, the processing operation of varying the relative position is ended. When the cyclic processing operation of a specific number of times is ended, the gas supply/exhaust processing operation is also ended.

(Gas Supply/Exhaust Processing Operation)

The gas supply/exhaust processing operation in the film formation step (S103) will be described next.

Figure 5:
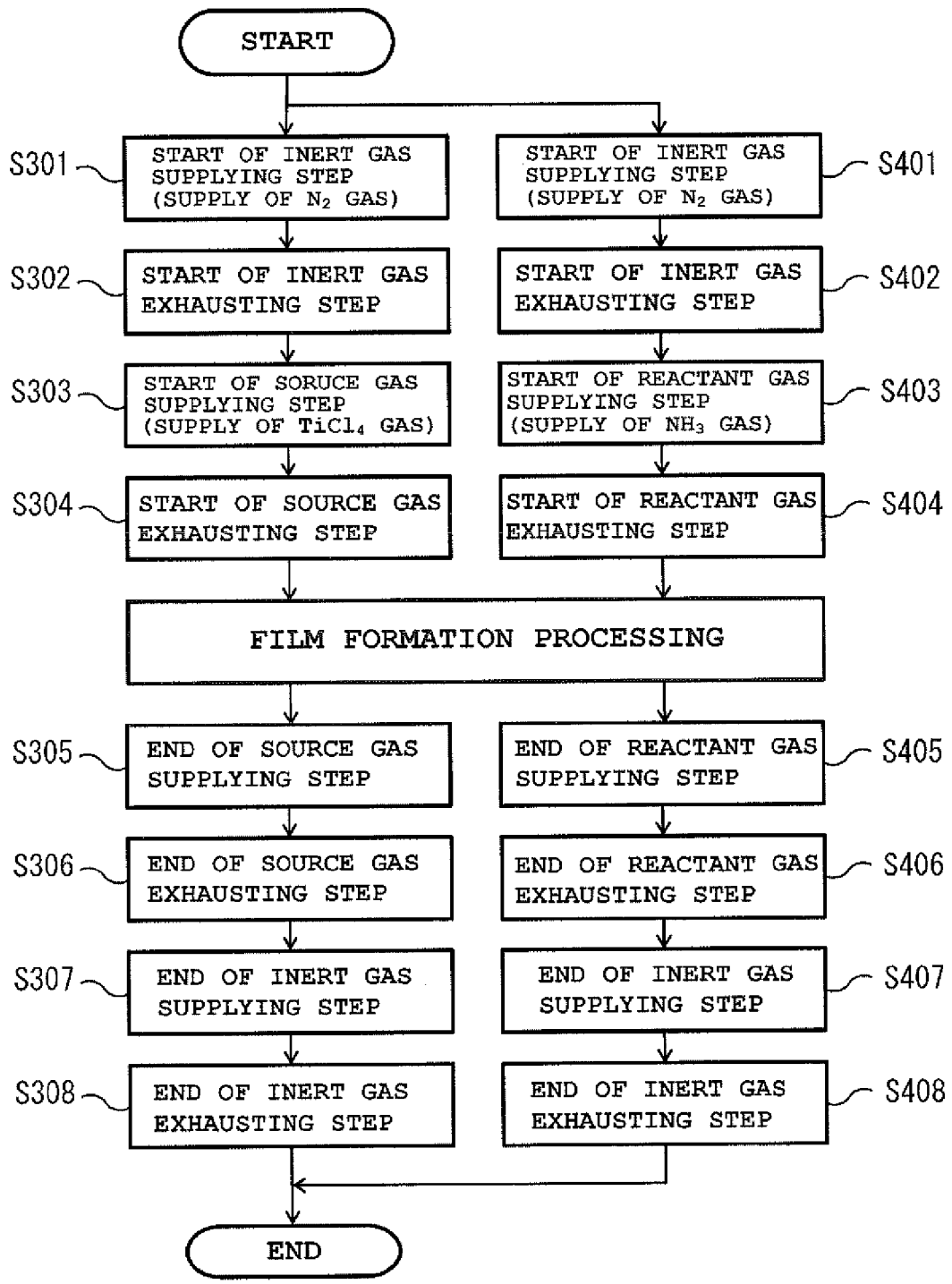
FIG. 5 is a flowchart showing a detail of a gas supply/exhaust processing operation performed in the film formation step of FIG. 3.

FIG. 5 is a flowchart showing the detail of the gas supply/exhaust processing operation performed in the film formation step of FIG. 3.

The gas supply/exhaust processing operation includes a processing operation using the cartridge part 230b for source gas (S301 to S304, and S305 to S308), and a processing operation performed using the cartridge part 230c for reactant gas (S401 to S404, and S405 to S408).

In the gas supply/exhaust processing operation using the cartridge part 230b for source gas, the inert gas supplying step (S301) and the inert gas exhausting step (S302) are started first.

In the inert gas supplying step (S301), the valve 254 of the inert gas supply system connected to the cartridge part 230b for source gas is set in an open-state, and the MFC 253 is adjusted so that the flow rate reaches a specific flow rate, to thereby supply the inert gas on the wafer 200 from the upper side of the substrate mounting table 210, through the inert gas supply hole 235 of the source gas cartridge part 230b. The supply flow rate of the inert gas is 100 to 10000 sccm for example.

In the inert gas exhausting step (S302), the valve 272 is set in an open-state while operating the vacuum pump 274 of the inert gas exhaust system connected to the cartridge part 230b for source gas, and the inert gas supplied on the surface of the wafer 200 mainly by the inert gas supply part 234, is exhausted to the upper side of the wafer 200, through the inert gas exhaust hole 237b of the source gas cartridge part 230b. At this time, the pressure in the lower space of the inert gas supply part 234 of the cartridge part 230b for source gas, is controlled to a specific pressure by the pressure control unit 273 of the inert gas exhaust system. The specific pressure is preferably a higher pressure than the pressure in the lower space of the processing gas supply part 232.

By performing the abovementioned inert gas supplying step (S301) and inert gas exhausting step (S302), an air seal is formed by the inert gas in the lower space of the inert gas supply part 234 of the source gas cartridge part 230b. In addition, the inert gas supply parts 234 of the source gas cartridge part 230b is disposed at both sides of the processing gas supply part 232 of the source gas cartridge part 230b. Therefore, the lower space of the processing gas supply part 232 is sealed by the air seal of the inert gas from the inert gas supply part 234.

Further, in the gas supply/exhaust processing operation performed to the source gas cartridge part 230b, the source gas supplying step (S303) and the source gas exhausting step (S304) are started.

In the source gas supplying step (S303), the source (TiCl$_4$) is vaporized, to thereby generate (pre-vaporize) the source gas (namely TiCl$_4$ gas). The pre-vaporization of the source gas may be performed in parallel to the abovementioned substrate loading step (S101) and pressure temperature adjustment step (S102), etc. This is because a specific time is required for stably generating the source gas.

Then, when the source gas is generated, the valve 244 of the processing gas supply system connected to the cartridge part 230b for source gas is set in the open-state, and the MFC 243 is adjusted so that the flow rate reaches a specific flow rate, to thereby supply the source gas (TiCl$_4$ gas) on the wafer 200 from the upper side of the substrate mounting table 210, through the processing gas supply hole 233 of the source gas cartridge part 230b. The supply flow rate of the source gas is 10 to 3000 sccm for example.

At this time, the inert gas (N$_2$ gas) maybe supplied as the carrier gas of the source gas. The supply flow rate of the inert gas in this case is 10 to 5000 sccm for example.

In the source gas exhausting step (S304), the valve 262 is set in the open-state while operating the vacuum pump 264 of the processing gas exhaust system connected to the cartridge part 230b for source gas, and the source gas supplied on the surface of the wafer 200 mainly by the processing gas supply part 232, is exhausted to the upper side of the wafer 200, through the processing gas exhaust hole 237a of the source gas cartridge part 230b. At this time, the pressure in the lower space of the processing gas supply part 232 of the source gas cartridge part 230b is controlled to a specific pressure by the pressure control unit 263 of the processing gas exhaust system. The specific pressure is preferably lower than the pressure in the lower space of the inert gas supply part 234.

By performing the abovementioned source gas supplying step (S303) and source gas exhausting step (S304), the source gas is supplied and stays in the lower space of the processing gas supply part 232 of the source gas cartridge part 230b. In addition, the air seal of the inert gas by the inert gas supply part 234 is formed at both sides of the lower space of the processing gas supply part 232. Therefore, even if the source gas stays in the lower space of the processing gas supply part 232, the source gas can be prevented from leaking to outside of the lower space of the source gas cartridge part 230b.

The abovementioned each step (S301 to S304) is parallelly performed in the film formation step (S103). However, it can be considered that a start timing is determined in the abovementioned order for improving the sealing performance by the inert gas. However, the present invention is not necessarily limited thereto, and each step (S301 to S304) may be simultaneously started.

Meanwhile, in the gas supply/exhaust processing operation performed using the cartridge part 230c for reactant gas, the inert gas supplying step (S401) and the inert gas exhausting step (S402) are started first. Each step (S401, S402) may be performed similarly to the above-described inert gas supplying step (S301) and the inert gas exhausting step (S302), and therefore explanation is omitted here.

Further, in the gas supply/exhaust processing operation performed using the cartridge part 230c for reactant gas, the reactant gas supplying step (S403) and the reactant gas exhausting step (S404) are started.

In the reactant gas supplying step (S403), the valve 244 of the processing gas supply system connected to the cartridge part 230c for reactant gas is set in the open-state, and the MFC 243 is adjusted so that the flow rate reaches a specific flow rate, to thereby supply the reactant gas (NH$_3$ gas) on the wafer 200 from the upper side of the substrate mounting table 210, through the processing gas supply hole 233 of the reactant gas cartridge part 230c. The supply flow rate of the source gas is 10 to 10000 sccm for example.

At this time, the inert gas (N$_2$ gas) may be supplied as the carrier gas of the reactant gas or the diluent gas. The supply flow rate of the inert gas in this case, is 10 to 5000 sccm for example.

In the reactant gas exhausting step (S404), the valve 262 is set in the open-state while operating the vacuum pump 264 of the processing gas exhaust system connected to the cartridge part 230c for reactant gas, to thereby exhaust the reactant gas supplied on the surface of the wafer 200 by the processing gas supply part 232, to the upper side of the wafer 200, through the processing gas exhaust hole 237a of the reactant gas cartridge part 230c. At this time, the pressure in the lower space of the processing gas supply part 232 of the reactant gas cartridge part 230c is controlled to a specific pressure, by the pressure control unit 263 of the processing gas exhaust system. The specific pressure is preferably lower than the pressure in the lower space of the inert gas supply part 234.

Thus, by performing the reactant gas supplying step (S403) and the reactant gas exhausting step (S404), the reactant gas is supplied and stays in the lower space of the processing gas supply part 232 of the cartridge part 230c for reactant gas. In addition, the air seal of the inert gas by the inert gas supply part 234 is formed at both sides of the lower space of the processing gas supply part 232. Therefore, even if the source gas stays in the lower space of the processing gas supply part 232, the source gas can be prevented from leaking to outside of the lower space of the source gas cartridge part 230b.

The abovementioned each step (S401 to S404) is parallelly performed in the film formation step (S103). However, it can be considered that a start timing is determined in the abovementioned order for improving the sealing performance by the inert gas. However, the present invention is not necessarily limited thereto, and each step (S401 to S404) may be simultaneously started. The same thing can be said for the relation between each step (S301 to S304) of the gas supply/exhaust processing operation and the source gas cartridge part 230b. Namely, if the above-mentioned each step is performed in parallel during the film formation step (S103), each step (S301 to S304) performed to the cartridge part 230b for source gas, and each step (S401 to S404) performed to the cartridge part 230c for reactant gas, may be started at different timing or may be started simultaneously.

When the gas supply/exhaust processing operation is ended, the source gas supplying step (S305) and the source gas exhausting step (S306) are ended, and subsequently the inert gas supplying step (S307) and the inert gas exhausting step (S308) are ended, which are performed to the cartridge part 230b for source gas. Further, the reactant gas supplying step (S405) and the reactant gas exhausting step (S406) are ended, and subsequently the inert gas supplying step (S407) and the inert gas exhausting step (S408) are ended, which are performed to the cartridge part 230c for reactant gas. However, an end timing of each step (S305 to S308, and S405 to S408) is also the same as the abovementioned start timing, and each step may be ended at different timing respectively or may be ended simultaneously.

(Gas Flow in the Gas Supply/Exhaust Processing Operation)

A gas flow in the lower space of the cartridge part 230b for source gas or the cartridge part 230c for reactant gas in the case of performing the abovementioned each step (S301 to S304 and S401 to S404) will be more specifically described next.

Here, a comparative example of the first embodiment will be simply described first.

Figure 6:
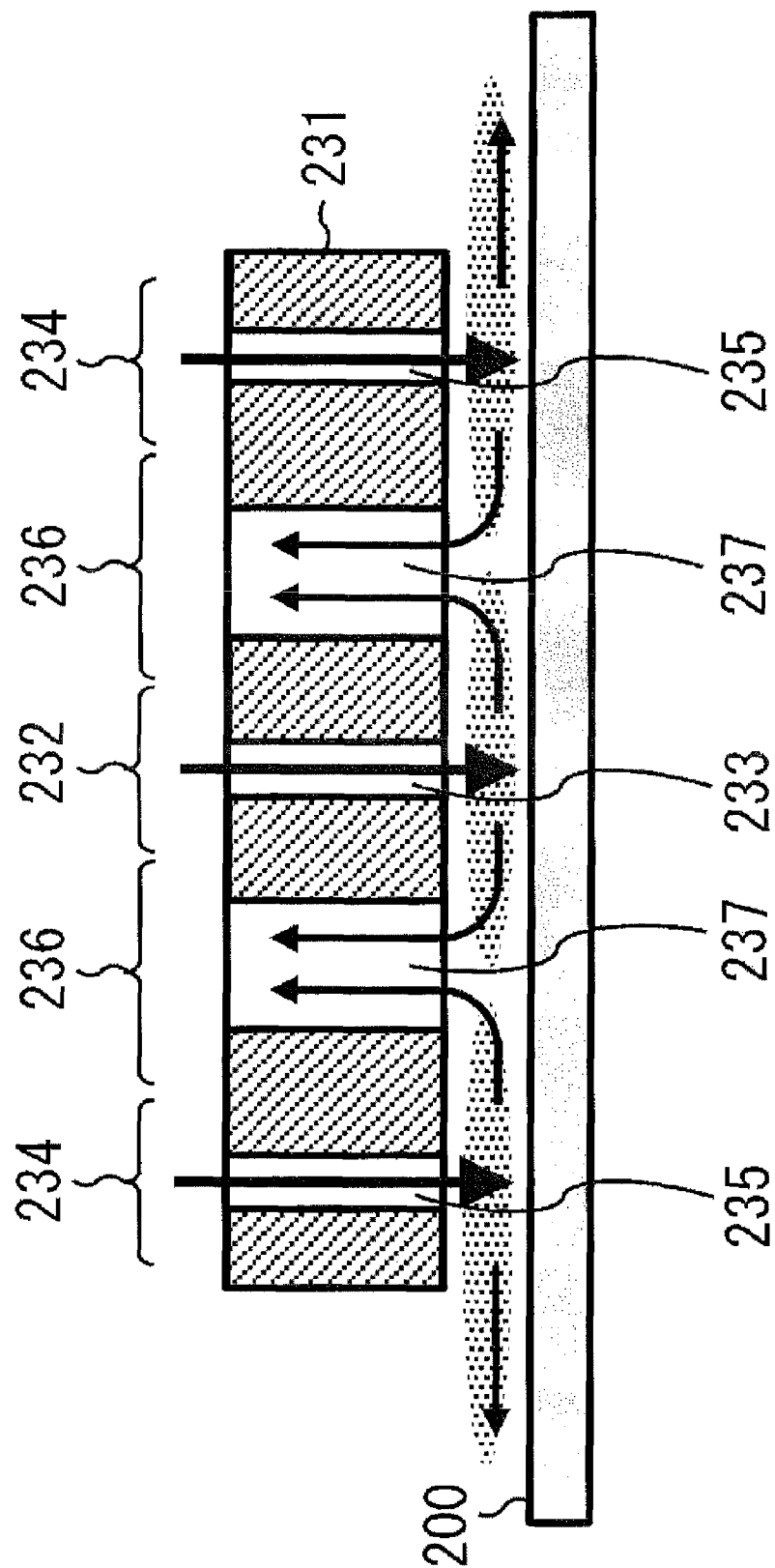
FIG. 6 is a cross-sectional view showing a detailed constitutional example of the essential part of the substrate processing apparatus according to a comparative example of the present invention.

FIG. 6 is a cross-sectional view showing a detailed constitutional example of an essential part of a substrate processing apparatus according to a comparative example. In the structure of the comparative example, not a plurality of numbers of, but a single number of gas exhaust part 236 is disposed between the processing gas supply part 232 and the inert gas supply part 234 at one side, and between the processing gas supply part 232 and the inert gas supply part 234 at the other side respectively. Then, both of the processing gas from the processing gas supply part 232 and the inert gas from the inert gas supply part 234, are exhausted to the upper side of the wafer 200 through the gas exhaust hole 237 of the gas exhaust part 236. More specifically, an extra inert gas from the inert gas supply part 234 is exhausted to the outside (lateral side) of the cartridge base 231 while forming the air seal in the lower space of the inert gas supply part 234, and is also exhausted to the upper side of the wafer 200 by the gas exhaust part 236. Further, the processing gas (source gas or reactant gas) from the processing gas supply part 232 stays in the lower space of the processing gas supply part 232 in a sealed state by the air seal of the inert gas, and an extra processing gas is exhausted to the upper side of the wafer 200 by the gas exhaust part 236. Namely, the same gas exhaust part 236 is shared for exhausting the processing gas and exhausting the inert gas.

However, in such a structure, the number of the gas exhaust part 236 is a single number, and therefore the same gas exhaust part 236 is shared for exhausting the processing gas and exhausting the inert gas, thus involving a problem that the film formation processing cannot be appropriately performed to the wafer 200. Specifically, for example if the pressure in the lower space of the processing gas supply part 232 is higher than the pressure in the lower space of the inert gas supply part 234, air seal by the inert gas does not function, and therefore probably leak of the processing gas occurs to the outside (lateral side) of the cartridge base 231. In this case, the source gas and the reactant gas coexist on the surface of the wafer 200, and there is a possibility that an undesired reaction byproduct, etc., is generated, and as a result the film formation processing cannot be appropriately performed. Also, if the pressure in the lower space of the inert gas supply part 234 is higher than the pressure in the lower space of the processing gas supply part 232 for example, the inert gas probably flows to the lower space of the processing gas supply part 232 beyond the gas exhaust part 236. In this case, the processing gas supplied to the lower space of the processing gas supply part 232 is diluted, and as a result, the film formation processing cannot be appropriately performed.

Meanwhile, as described above with reference to FIG. 2, in each one of the cartridge parts 230b and 230c of the first embodiment, a plurality of gas exhaust parts 236a, 236b are disposed between the processing gas supply part 232 and the inert gas supply part 234 at one side, and between the processing gas supply part 232 and the inert gas supply part 234 at the other side respectively. Therefore, the gas flow as described below is realized in the lower space of each one of the cartridge part 230b and 230c.

More specifically, an extra inert gas from the inert gas supply part 234 is exhausted to the outside (lateral side) of the cartridge base 231 while forming the air seal in the lower space of the inert gas supply part 234, and is also exhausted to the upper side of the wafer 200 by the gas exhaust part 236b disposed closely to the inert gas supply part 234. Also, the processing gas (source gas or reactant gas) from the processing gas supply part 232 stays in the lower space of the processing gas supply part 232 in a sealed state by the air seal of the inert gas, and an extra processing gas is exhausted to the upper side of the wafer 200 by the gas exhaust part 236a disposed closely to the processing gas supply part 232. Namely, the processing gas from the processing gas supply part 232 is exhausted mainly by the processing gas exhaust part 236a, and the inert gas from the inert gas supply part 234 is exhausted mainly by the inert gas exhaust part 236b, thus sharing a role by a plurality of gas exhaust parts 236a and 236b respectively.

Accordingly, in each one of the cartridge part 230a and 230c of the first embodiment, for example if the pressure in the lower space of the processing gas supply part 232 is higher than the pressure in the lower space of the inert gas supply part 234, the inert gas is exhausted by the inert gas exhaust part 236b, and therefore the inert gas does not flow into the lower space of the processing gas supply part 232 beyond the processing gas exhaust part 236a. Further, the pressure in the lower space of the inert gas supply part 234 can be higher than the pressure in the lower space of the processing gas supply part 232, and therefore the inert gas can surely function as an air seal, and the leak of the processing gas to outside (lateral side) of the cartridge base 231 can be prevented. Namely, according to each one of the cartridge part 230b and 230c of this embodiment, each kind of gases is not allowed to coexist and can be supplied on the surface of the wafer 200 in a separated state, and as a result, appropriate film formation processing can be realized.

(Substrate Unloading Step: S104)

After the above-described film formation step (S103) is performed, as shown in FIG. 3, the substrate unloading step (S104) is performed next. In the substrate unloading step (S104), the processed wafer 200 is unloaded to outside of the processing vessel using a wafer transfer machine, by a procedure opposite to the above described substrate loading step (S101).

(Processing Number Judging Step: S105)

After unloading the wafer 200, the controller 280 judges whether or not the number of times of executing a series of each step of the substrate unloading/mounting step (S101), the film formation step (S102), and the substrate unloading step (S103) reaches a specific number of times (S104). When it is so judged that the number of times of executing each step reaches the specific number of times, processing is advanced to a cleaning step (S105). When it is so judged that the number of times of executing each step does not reach the specific number of times, the processing is advanced to the substrate loading/mounting step (S101), to start the processing of a succeedingly standby wafer 200. Also, when it is so judged that the number of times of executing each step reaches the specific number of times, the series of each step is ended after performing the cleaning step to the processing vessel, etc., as needed. The cleaning step can be performed using a publicly-known technique, and therefore explanation is omitted.

(3) Effect of the First Embodiment

According to this embodiment, one or a plurality of following effects can be exhibited.

According to the first embodiment, a plurality of gas exhaust parts 236a and 236b are disposed between the processing gas supply part 232 and the inert gas supply parts 234, so that each kind of gases supplied on the surface of the wafer 200 is exhausted to the upper side of the wafer 200 by each one of the gas exhaust parts 236a and 236b. Accordingly, the processing gas from the processing gas supply part 232 is exhausted mainly by a part of the plurality of gas exhaust parts 236a and 236b, and the inert gas from the inert gas supply part 234 is exhausted mainly by other part of the plurality of gas exhaust parts 236a and 236b, thus sharing the role by the plurality of gas exhaust parts 236a and 236b respectively. Namely, by sharing the role by the plurality of gas exhaust parts 236a and 236b, the inert gas is prevented from flowing into the lower space of the processing gas supply part 232, and the processing gas can be prevented from being diluted in the lower space. Therefore, efficiency of the film formation processing using the processing gas is not reduced. Further, the inert gas can surely function as an air seal, and the leak of the processing gas to the outside (lateral side) of the cartridge 231 can be prevented. Therefore, each kind of gases is not allowed to coexist and can be supplied on the surface of the wafer 200 in a separated state, and as a result, appropriate film formation processing can be realized.

Further, according to the first embodiment, by sharing the role by the plurality of gas exhaust parts 236a and 236b, the pressure in the lower space of the inert gas supply part 234 can be higher, thereby also realizing a high pressure in the lower space of the processing gas supply part 232 in a range not exceeding the pressure in the lower space of the inert gas supply part 234. When the pressure in the lower space of the processing gas supply part 232 can be higher, a film formation rate can be improved owing to improvement of the pressure of the processing gas. Namely, by sharing the role by the plurality of gas exhaust parts 236a and 236b, efficiency of the film formation processing can also be improved.

Further, according to the first embodiment, the role is shared by the plurality of gas exhaust parts 236a and 236b, and an independent gas exhaust system is connected thereto respectively, to thereby individually set an exhaust rate of the processing gas and an exhaust rate of the inert gas. Thus, a supply rate of the processing gas and a supply rate of the inert gas can also be individually set, in such manner that the supply rate of the inert gas is set to be larger than the supply rate of the processing gas for example. This is considerably suitable for improving the sealing performance of the air seal by the inert gas, and realizing a higher pressure in the lower space of the processing gas supply part 232.

(b) Further, according to the first embodiment, a plurality of gas exhaust parts 236a and 236b include the processing gas exhaust part 236a disposed closely to the processing gas supply part 232, and the inert gas exhaust part 236b disposed closely to the inert gas supply part 234. Accordingly, the role can be suitably shared by the plurality of gas exhaust parts 236a and 236b respectively, from a positional relation between each one of the gas supply parts 232 and 234, and each one of the gas exhaust parts 236a and 236b. Namely, each kind of gases is not allowed to coexist and can be supplied on the surface of the wafer 200 in a separated state, and as a result, appropriate film formation processing can be realized.

(c) Further, according to the first embodiment, the inert gas supply part 234 is disposed at both sides of the processing gas supply part 232, and a plurality of gas exhaust parts 236a and 236b are provided between the processing gas supply part 232 and the inert gas supply part 234 at one side, and between the processing gas supply part 232 and the inert gas supply part 234 at the other side respectively. Thus, the air seal by the inert gas is formed in the lower space at both sides of the processing gas supply part 232, thus sealing the lower space (namely the space in which the processing gas is supplied and stays). Accordingly, even in a case of performing the film formation step (S103) by sequentially passing each one of the cartridge parts 230b and 230c through the surface of the wafer 200, coexistence of different kinds of processing gases (source gas, reactant gas) on the surface of the wafer 200, can be prevented.

(d) Further, according to the first embodiment, the film formation processing is applied to the surface of the wafer 200 by varying a relative position of the substrate mounting table 210, and each one of the cartridge parts 230b and 230c of the cartridge head 230 by the moving mechanism. Accordingly, a consumption amount of the processing gas (source gas or reactant gas) can be suppressed compared with a case that the processing vessel is filled with the source gas or the reactant gas, and these gases are alternately exchanged through a purging step. In this point as well, an efficient film formation processing can be realized. Namely, a maximum film formation rate can be obtained with a minimum gas use amount.

(e) Further according to the first embodiment, the cartridge head 230 having radially extending plurality of (for example four) cartridge parts 230b and 230c, is disposed on the upper side of the substrate mounting table 210 on which a plurality of (for example five) wafers 200 are mounted, and the relative position of the substrate mounting table 210 and each one of the cartridge parts 230b and 230c is moved in the rotating direction by rotary-driving the cartridge head 230 by the moving mechanism. Accordingly, the structure of the moving mechanism, etc., can be simplified and a plurality of wafers 200 can be simultaneously processed, compared with a case that the relative position of the substrate mounting table 210 and each one of the cartridge parts 230b and 230c is moved in a straight direction. Therefore productivity of the film formation processing can b improved.

(f) Further according to this embodiment, each one of the cartridge parts 230b and 230c of the cartridge head 230 is configured to supply different kinds of processing gases. Namely, the cartridge part 230b for source gas supplies the source gas ($TiCl_4$ gas) on the surface of the wafer 200, and the cartridge part 230c for reactant gas supplies the reactant gas ($NH_3$ gas) on the surface of the wafer 200. Accordingly, when each one of the cartridge parts 230b and 230c sequentially passes through the surface of the wafer 200 mounted on the substrate mounting table 210, the TiN film is formed on the surface of the wafer 200 without a necessity for exchanging the processing gas or interposing the purging step, etc. Therefore high throughput of the film formation processing can be realized. In addition, in this case as well, as already described above, each processing gas (source gas or reactant gas) is not allowed to coexist and can be supplied on the surface of the wafer 200 in a separated state, and as a result, appropriate film formation processing can be realized.

<Second Embodiment of the Present Invention>

A second embodiment of the present invention will be described next, with reference to the drawings. However, different points from the abovementioned first embodiment will be mainly described here, and explanation for the other point is omitted.

Here, first, the structure of a comparative example shown in FIG. 6 described in the first embodiment, will be simply described again. In the structure of the comparative example as well, if the pressure in the lower space of the processing gas supply part 232 and the pressure in the lower space of the inert gas supply part 234 are appropriately set, the processing gas can be supplied to the lower space of the processing gas supply part 232 sealed by the inert gas while making the inert gas function as the air seal, without being diluted. In this case, in order to improve the function of the inert gas as an air seal, an interval between the upper surface of the wafer 200 and the lower surface of the cartridge base 231 constituting the inert gas supply part 234, is preferably set narrower as much as possible, in a range of not inhibiting the processing operation of varying the relative position performed in the film formation step (S103).

However, in the structure of the comparative example, the lower surface of the cartridge base 231 constitutes the same surface in either portion of the processing gas supply part 232 and the inert gas supply part 234. Namely, the lower surface of the processing gas supply part 232 and the lower surface of the inert gas supply part 234 are the same height. Accordingly, if the interval between the upper surface of the wafer 200 and the lower surface of the inert gas supply part 234 are narrower, the interval between the upper surface of the wafer 200 and the lower surface of the processing gas supply part 232 also becomes narrower accordingly.

When the interval between the upper surface of the wafer 200 and the lower surface of the processing gas supply part 232 becomes narrower, the processing gas does not uniformly spread, thus generating a variation in a concentration distribution of the processing gas, even if the processing gas is supplied on the surface of the wafer 200 through the processing gas supply hole 233. If the film formation processing is performed in this state, there is a possibility that in-plane uniformity of the film thickness of a thin film obtained by the film formation processing, is damaged.

Therefore, in the substrate processing apparatus 100 according to the second embodiment of the present invention, each one of the cartridge parts 230b and 230c is configured as follows, to further improve the in-plane uniformity of the film thickness of the thin film obtained by the film formation processing.

(4) Structure of the Cartridge Part according to the Second Embodiment

Figure 7:
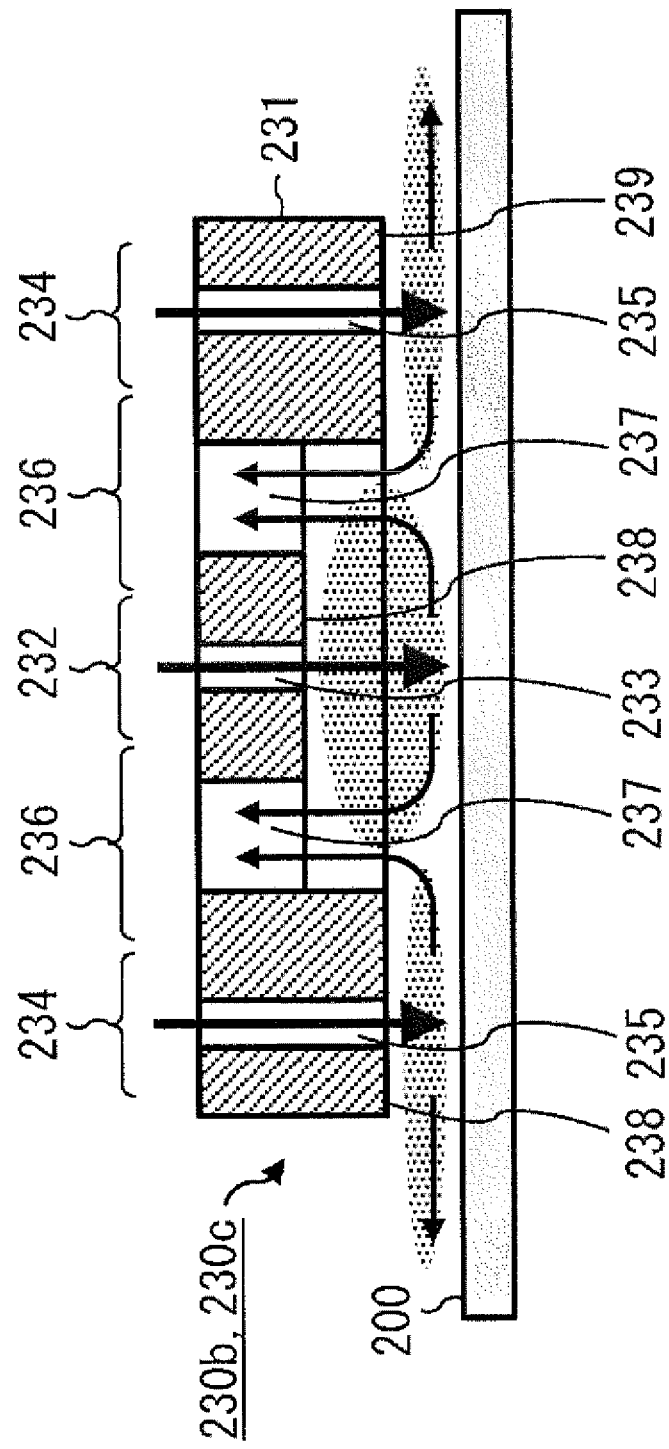
FIG. 7 is a cross-sectional view showing a detailed constitutional example of an essential part of a substrate processing apparatus according to a second embodiment of the present invention.

FIG. 7 is a cross-sectional view showing a detailed constitutional example of an essential part of a substrate processing apparatus according to the second embodiment of the present invention.

Similarly to the abovementioned structure of the comparative example, each one of the cartridge parts 230b and 230c of the second embodiment, is configured to supply the processing gas on the surface of the wafer 200 from approximately near the center of the cross-sectional surface of the cartridge base 231 through the processing gas supply hole 233, and supply the inert gas from near the both ends of the cartridge base 231 through the inert gas supply hole 235, and exhaust the processing gas and the inert gas supplied on the surface of the wafer 200 through the gas exhaust hole 237 disposed between them. Thus, the air seal by the inert gas is formed in the lower space of the inert gas supply part 234, and the processing gas supplied to the lower space of the processing gas supply part 232, is exhausted from the gas exhaust hole 237 without causing a leak to occur to outside (lateral side) of the cartridge base 231.

Further, each one of the cartridge parts 230b and 230c of the second embodiment is disposed so that lower surface 239 of the inert gas supply part 234 positioned at both sides is disposed more closely to the wafer 200, than a lower surface 238 of the processing gas supply part 232. Then, the interval between the lower surface 239 of the inert gas supply part 234 and the upper surface of the wafer 200 is set narrower as much as possible, in a range of not inhibiting the processing operation of varying the relative position performed in the film formation step (S103). However, even in this case, a certain degree of space is secured between the lower surface 238 of the processing gas supply part 232 and the upper surface of the wafer 200 even if the interval between the upper surface of the wafer 200 and the lower surface 239 of the inert gas supply part 234 is set narrower, because the lower surface 238 of the processing gas supply part 232 and the lower surface 239 of the inert gas supply part 234 are positioned at different heights.

Note that the position of the lower surface 238 of the processing gas supply part 232 in a height direction, coincides with a lower end position of the processing gas supply hole 233 constituting the processing gas supply part 232. Also, the position of the lower surface 239 of the inert gas supply part 234 in a height direction coincides with a lower end position of the inert gas supply hole 235 constituting the inert gas supply part 234.

In the cartridge parts 230b and 230c thus configured, the sealing performance of the air seal by the inert gas formed by the inert gas supply part 234, is improved by disposing the lower surface 239 of the inert gas supply part 234 closely to the wafer 200. In addition, in this case as well, the processing gas supplied to the lower space of the processing gas supply part 232 is uniformly spread, because the distance between the lower surface 238 of the processing gas supply part 232 and the upper surface of the wafer 200 is secured. Namely, variation of the concentration distribution of the processing gas in the lower space of the processing gas supply part 232 is suppressed, thus improving the in-plane uniformity of the film thickness of the thin film obtained by the film formation processing.

Further, in each one of the cartridge parts 230b and 230c thus configured, a pressure difference can be provided inside/outside of the cartridge, by suitably adjusting the interval between the upper surface of the wafer 200 and the lower surface 239 of the inert gas supply part 234, and the flow rate of the inert gas supplied from the inert gas supply part 234. Specifically, the pressure of inside/outside of the cartridge can be set to a desirable pressure in such a manner that the pressure outside of the cartridge is set to be low for purging byproducts, etc., and the pressure inside of the cartridge is set to be high for increasing the film formation rate, and the processing gas can be efficiently used. Note that the inside of the cartridge means the space between the wafer 200 and the cartridge base 231, and particularly means the lower space of the processing gas supply part 232. Further, the outside of the cartridge means an outer side (lateral side) of the cartridge base 231.

Figure 8:
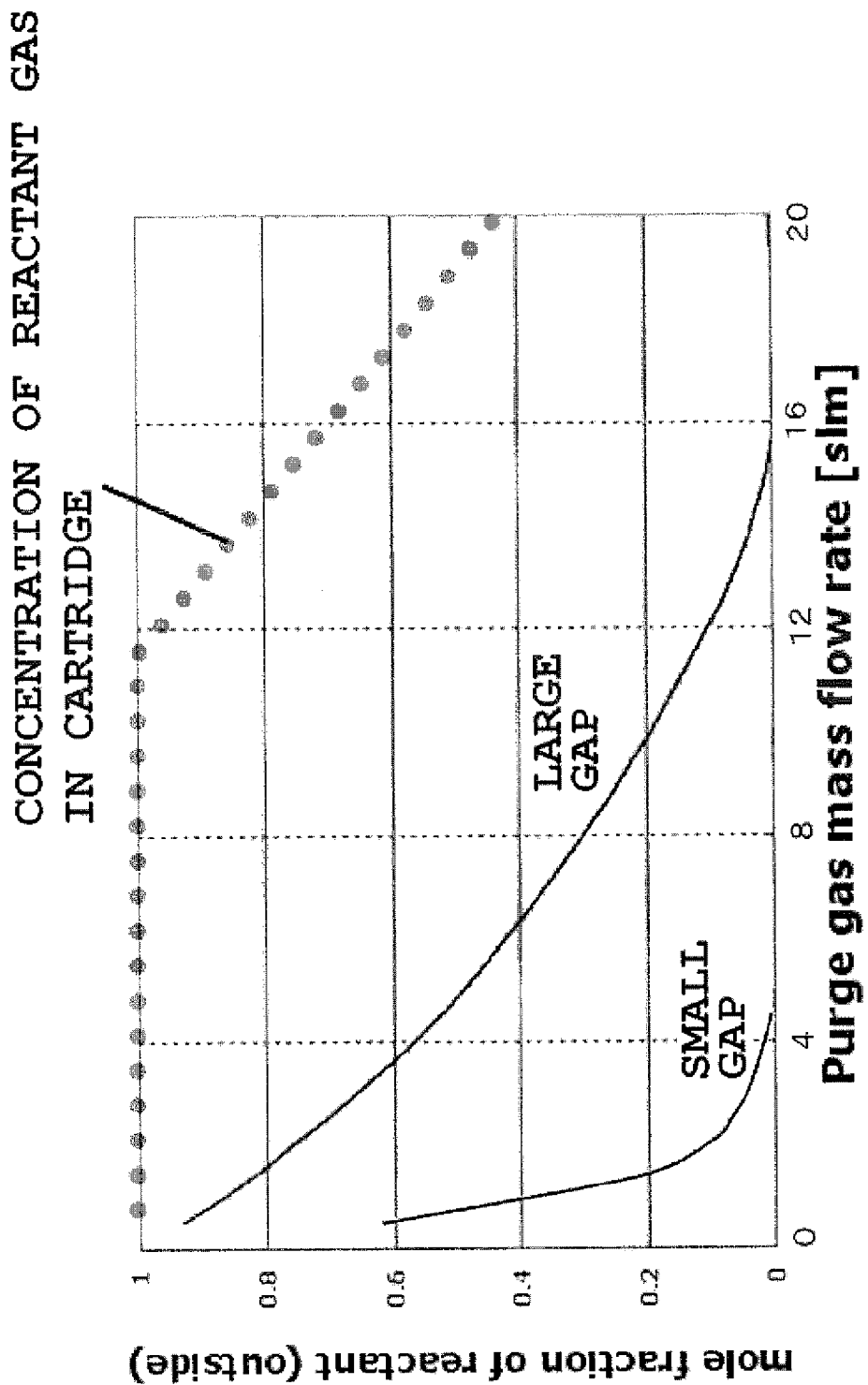
FIG. 8 is an explanatory view showing a result of analyzing a relation between a flow rate of an inert gas and a gap between wafer and cartridge, and a sealing performance by the inert gas, when a pressure in a cartridge is higher than a pressure outside of the cartridge, according to a second embodiment of the present invention.

FIG. 8 is an explanatory view showing a result of analyzing a relation between the flow rate of the inert gas and the gap between wafer and cartridge, and the sealing performance by the inert gas. In the figure, the horizontal axis indicates the flow rate of the inert gas, and the vertical axis indicates a mole fraction (namely, leak amount) of the reactant gas outside of the cartridge.

According to the analysis result of the figure, the leak amount of the reactant gas is small, as the flow rate of the inert gas is increased and the gap between wafer and cartridge is smaller, and it is found that the sealing performance is excellent. However, regarding the gap between wafer and cartridge, the interval of not inhibiting the processing operation of varying the relative position performed by the film formation processing (S103) is required. Accordingly, in order to improve the sealing performance, there is a necessity for supplying a certain flow rate of inert gas from the inert gas supply part 234. Meanwhile, if an excessive flow rate of inert gas is supplied, a large quantity of inert gas enters into the cartridge, thus involving a problem of reducing the concentration of the reactant gas in the cartridge and reducing the film formation efficiency. Therefore, it can be considered that the flow rate of the inert supplied from the inert gas supply part 234, is set to be larger than the flow rate of compensating the gap between wafer and cartridge, and smaller than the flow rate of causing a reduction of the concentration of the reactant gas in the cartridge.

(5) Effect of the Second Embodiment

According to the second embodiment, the following one or a plurality of effects can be exhibited.

(g) According to the second embodiment, the lower surfaces 239 of the inert gas supply parts 234 positioned at both sides of the processing gas supply part 232, are disposed more closely to the wafer 200 than the lower surface 238 of the processing gas supply part 232. Therefore, the sealing performance of the air seal by the inert gas formed by the inert gas supply part 234 can be easily improved. In addition, the processing gas supplied to the lower space of the processing gas supply part 232 can be uniformly spread, because the distance between the lower surface 238 of the processing gas supply part 232 and the upper surface of the wafer 200 can be secured even if the sealing performance of the air seal by the inert gas is improved. Namely, the variation of the concentration distribution of the processing gas in the lower space of the processing gas supply part 232 can be suppressed compared with a case that the lower surface of the processing gas supply part 232 and the lower surface of the inert gas supply part 234 constitute the same surface, thus improving the in-plane uniformity of the film thickness of the thin film obtained by the film formation processing.

(h) Further, according to the second embodiment, the lower surface 239 of the inert gas supply part 234 positioned at both sides, is disposed more closely to the wafer 200, than the lower surface 238 of the processing gas supply part 232. Therefore, the pressure difference can be easily provided inside/outside of the cartridge. Specifically, a desired pressure can be set inside/outside of the cartridge, in such a manner that the pressure outside of the cartridge is set to be low for purging the byproduct, etc., and the pressure inside of the cartridge is set to be high for increasing the film formation rate, and the processing gas can be efficiently used.

<Third Embodiment of the Present Invention>

A third embodiment of the present invention will be described next, with reference to the drawings. However, different points from the abovementioned first embodiment will be mainly described here, and explanation for the other point is omitted.

(6) Structure of the Cartridge Part according to the Third Embodiment

Figure 9:
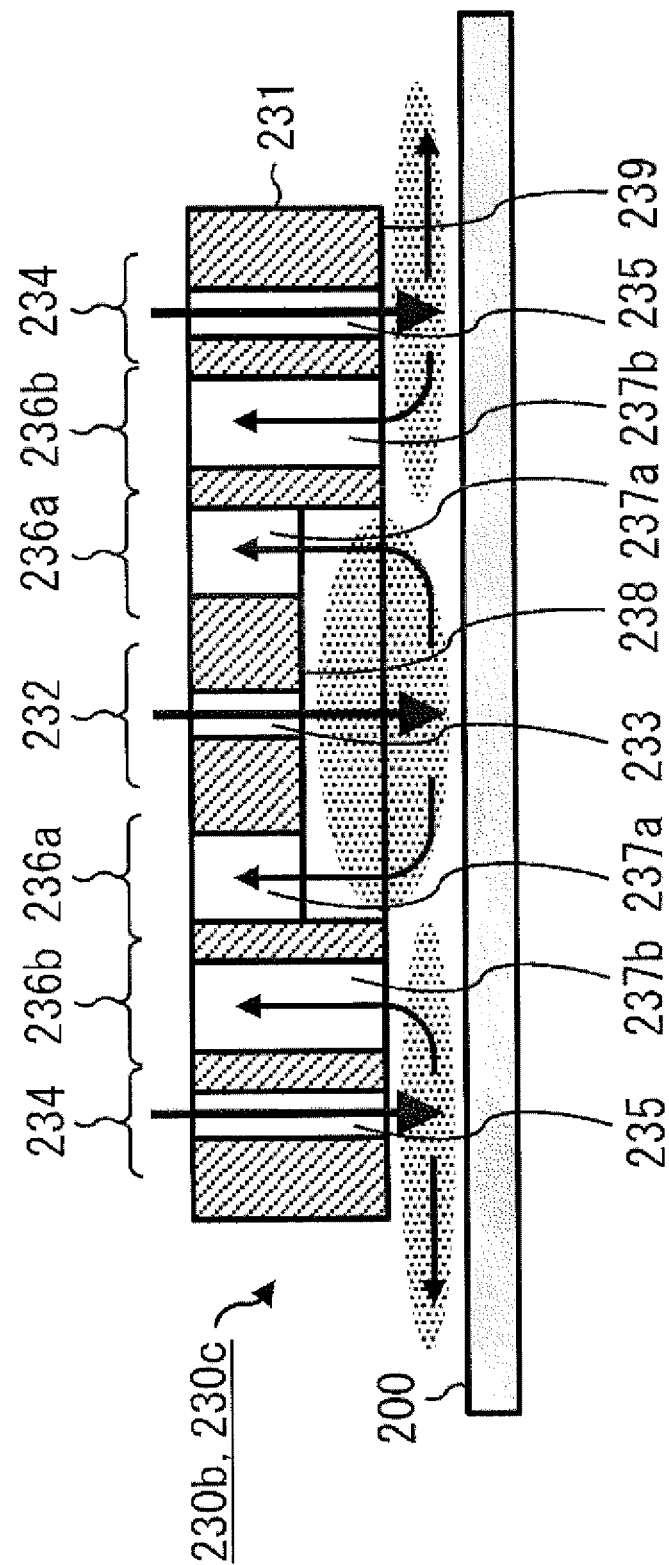
FIG. 9 is a cross-sectional view showing a detailed constitutional example of an essential part of a substrate processing apparatus according to a third embodiment of the present invention.

FIG. 9 is a cross-sectional view showing a detailed constitutional example of an essential part of a substrate processing apparatus according to the third embodiment.

(Basic Structure)

Each one of the cartridge parts 230b and 230c of the third embodiment is configured by combining the structure described in the first embodiment and the structure described in the second embodiment.

Specifically, as described in the first embodiment, each one of the cartridge parts 230b and 230c includes: a plurality of gas exhaust parts 236a and 236b between the processing gas supply part 232 and the inert gas supply part 234; and include the processing gas exhaust part 236a disposed closely to the processing gas supply part 232, and the inert gas exhaust part 236b disposed closely to the inert gas supply part 234 as the plurality of gas exhaust parts. Then, the processing gas from the processing gas supply part 232 is exhausted to the upper side of the wafer 200 mainly by the processing gas exhaust part 236a, and the inert gas from the inert gas supply part 234 is exhausted to the upper side of the wafer 200 mainly by the inert gas exhaust part 236b.

Further, as described in the second embodiment, each one of the cartridge parts 230b and 230c is disposed so that the lower surface 239 of the inert gas supply part 234 positioned at both sides of the gas supply part 232 is disposed more closely to the wafer 200 than the lower surface 238 of the processing gas supply part 232.

Incidentally, each one of the cartridge parts 230b and 230c of the third embodiment includes the processing gas exhaust part 236a and the inert gas exhaust part 236b as a plurality of gas exhaust parts 236a and 236b. Regarding the processing gas exhaust part 236a of the gas exhaust parts 236a and 236b, the lower surface coincides with the lower surface 238 of the processing gas supply part 232 (namely, the lower surface of the processing gas exhaust part 236a is positioned at the same height as the lower surface 238 of the processing gas supply part 232). Note that the lower surface of the processing gas exhaust part 236a is the surface whose position in the height direction coincides with the lower end position of the processing gas exhaust hole 237a constituting the processing gas exhaust part 236a. Accordingly, in each one of the cartridge part 230b, 230c of the third embodiment, the lower surface 239 of the inert gas supply part 234 is disposed more closely to the wafer 200, than not only the lower surface 238 of the processing gas supply part 232 but also the lower surface of the processing gas exhaust part 236a. With this structure, in the processing space formed by the lower space of the processing gas supply part 232 and the lower space of the processing gas exhaust part 236a, the pressure of the processing gas which is supplied from the processing gas supply part 232 and stays in the processing space, can be equalized and the variation of the concentration distribution can be suppressed, thus improving the in-plan uniformity of the film thickness of the thin film obtained by the film formation processing.

Meanwhile, the lower surface of the inert gas exhaust part 236b of the plurality of gas exhaust parts 236a and 236b is configured to coincide with the lower surface 239 of the inert gas supply part 234 (namely, at the same height as the lower surface 239 of the inert gas supply part 234). Note that the lower surface of the processing gas exhaust part 236b called here is the surface whose position in the height direction coincides with the lower end position of the processing gas exhaust hole 237a constituting the processing gas exhaust part 236b. Accordingly, in each one of the cartridge part 230b, 230c of the third embodiment, the lower surface of the inert gas exhaust part 236b is disposed more closely to the wafer 200 than the lower surface of the processing gas exhaust part 236a. With this structure, pressures of the lower space of the inert gas supply part 234 and the inert gas exhaust part 236b can be easily higher, thus further improving the sealing performance of the air seal by the inert gas formed by the inert gas supply part 234. Note that when the lower surface of the inert gas exhaust part 236b is disposed more closely to the wafer 200 than the lower surface of the processing gas exhaust part 236a, there is no necessity for coincidence with the lower surface 239 of the inert gas supply part 234.

Here, explanation is given for the relation between the inert gas flow rate in each one of the cartridge parts 230b and 230c of the third embodiment configured as described above, and the gap between wafer and cartridges, and the sealing performance by the inert gas.

Figure 10:
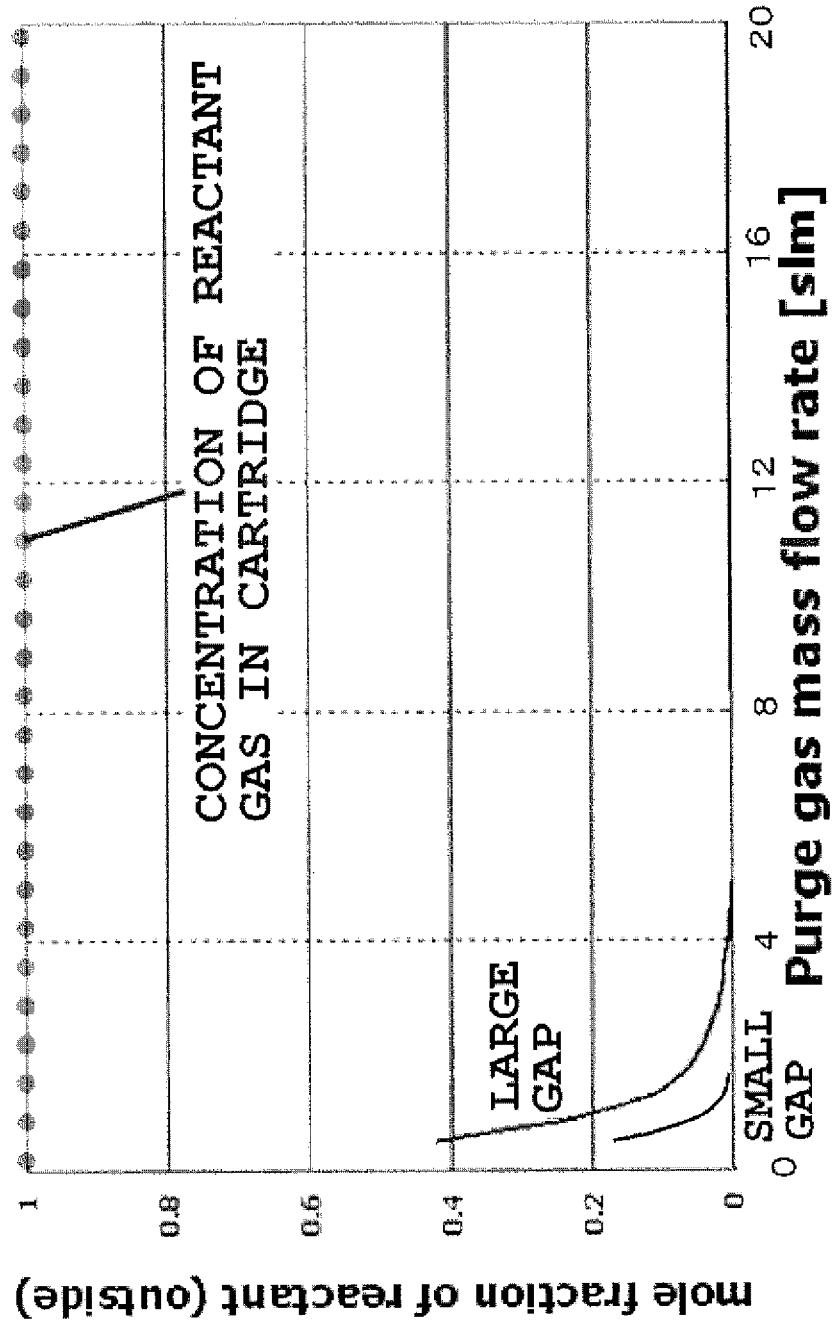
FIG. 10 is an explanatory view showing a result of analyzing a relation between a flow rate of an inert gas and a gap between wafer and cartridge, and a sealing performance by the inert gas, when a pressure in a cartridge is higher than a pressure outside of the cartridge, according to a third embodiment of the present invention.

FIG. 10 is an explanatory view showing a result of analyzing the relation between the flow rate of the inert gas and the gap between wafer and cartridge, and the sealing performance by the inert gas, when the pressure in the cartridge is higher than the pressure outside of the cartridge. In the figure, the horizontal axis indicates the flow rate of the inert gas, and the vertical axis indicates a mole fraction (namely a leak amount) of the reactant gas outside of the cartridge.

According to an analysis result of the example in the figure, similarly to the analysis result described in the second embodiment (see FIG. 8), the sealing performance by the inert gas is excellent, as the flow rate of the inert gas is larger and the gap between wafer and cartridge is smaller. However, it is found that the sealing performance in a case of a third embodiment structure is more excellent than the sealing performance in a case of a second embodiment structure, if they are compared under the same condition. Further even if the flow rate of the inert gas is increased, the inert gas is exhausted by the inert gas exhaust part 236b unlike the case of the second embodiment structure, and therefore the inert gas is prevented from flowing into the cartridge, thus maintaining the gas concentration in the cartridge. This point is more advantageous than the case of the second embodiment structure.

In view of the above-described point, a specific structure described below can be employed for each one of the cartridge parts 230b and 230c of the third embodiment. Regarding the cartridge part 230c for reactant gas, the following case is given here: $NH_3$ gas (100%) is supplied to the cartridge part 230c as the reactant gas, and $N_2$ gas (100%) is supplied thereto as the inert gas respectively, so that the pressure in the cartridge (particularly the lower space of the processing gas supply part 232) is 500 Pa, the pressure outside of the cartridge is 50 Pa, and the temperature outside of the cartridge is 350° C. In this case, the gap between wafer and cartridge is set to 3 mm or less, and preferably set to about 0.5 mm to 2 mm for example. Further, the flow rate of the $N_2$ gas is set to about 2 slm to 50 slm for example. More specifically, for example, when the gap between wafer and cartridge is about 1 mm, the flow rate of the $N_2$ gas is set to about 2 slm to 10 slm, and when the gap between wafer and cartridge is about 2 mm, the flow rate of the $N_2$ gas is set to 10 slm to 20 slm for example, and when the gap between wafer and cartridge is about 3 mm, the flow rate of the $N_2$ gas is set to about 50 slm.

(Structure for Further Improving the Sealing Performance)

In each one of the cartridge parts 230b and 230c of the third embodiment, the structure described below can be employed for further improving the sealing performance of the air seal by the inert gas.

For example, in each one of the cartridge parts 230b and 230c of the third embodiment, the inert gas exhaust part 236b has a higher exhaust power than the processing gas exhaust part 236a. Specifically, it can be considered that a gas exhaust flow rate by the inert gas exhaust system connected to the inert gas exhaust hole 237b of the inert gas exhaust part 236b is more increased than a gas exhaust flow rate by the processing gas exhaust system connected to the processing gas exhaust hole 237a of the processing gas exhaust part 236a. With this structure, a fresh processing gas supplied from the processing gas supply part 232 is prevented from being exhausted to outside of the cartridge, and the processing gas exposed to the wafer 200 and flowed to outside of the processing space is surely exhausted toward the upper side.

Further for example, in each one of the cartridge parts 230b and 230c of the third embodiment, the inert gas exhaust part 236b has a higher exhaust conductance than the processing gas exhaust part 236a. Namely, the gas is easily flowed through the inert gas exhaust part 236b. Specifically, a hole size of the processing gas exhaust hole 237b of the processing gas exhaust part 236b is formed larger than a hole size of the inert gas exhaust hole 237a of the processing gas exhaust part 236a, or a surface state of a wall surface in the hole is differentiated, to thereby adjust the exhaust conductance. With this structure as well, the fresh processing gas supplied from the processing gas supply part 232 is prevented from being exhausted to outside of the cartridge, and the processing gas exposed to the wafer 200 and flowed to outside of the processing space can be surely exhausted to the upper side.

In any structure, a gas pressure in a lower area of the inert gas supply part 234 is preferably set to be higher than a gas pressure in a lower area of the processing gas supply part 232, for improving the sealing performance of the air seal by the inert gas. The gas pressure may be adjusted using the pressure control unit 263 in the processing gas exhaust system or the pressure control unit 273, etc., in the inert gas exhaust system.

In each one of the cartridge parts 230b and 230c of the third embodiment, a separation distance between one processing gas exhaust part 236a and the other processing gas exhaust part 236a disposed at both sides of the processing gas supply part 232, is preferably set to be smaller than a planar size (namely a maximum diameter size) of the wafer 200. Here, the separation distance between processing gas exhaust parts 236a means a distance between outer edges of the processing gas exhaust parts 236a (namely a horizontal direction size of the processing space which is the lower space of the processing gas supply part 232 and the lower space of the processing gas exhaust part 236a), and more specifically means a distance between outside wall surfaces of the processing gas exhaust holes 237a of the processing gas exhaust parts 236a. With this structure, a distance formed by flow of a reaction inhibiting substance generated by the reaction of the processing gas (source gas or reactant gas) on the wafer 200 can be small, thus preventing deposition of the reaction inhibiting substance on the wafer 200.

(7) Effect of the Third Embodiment

According to the third embodiment, one or a plurality of following effects can be exhibited, in addition to the effect described in the first embodiment or the second embodiment.

(i) According to the third embodiment, the structure described in the first embodiment and the structure described in the second embodiment are combined. Therefore, the sealing performance of the air seal by the inert gas is improved and the leak amount of the processing gas is reduced even under the same condition, compared with the structure described in the second embodiment. Further, even if the flow rate of the inert as is increased, the inert gas is exhausted by the inert gas exhaust part 236b, and therefore the concentration of the processing gas in the cartridge is not decreased, and film formation efficiency is not reduced. In addition, the processing gas is uniformly spread in the cartridge compared with the structure described in the first embodiment, and the in-plane uniformity of the film thickness of the thin film obtained by the film formation processing can be improved.

Therefore, according to the third embodiment, the substrate processing apparatus 100 includes the cartridge part 230b for source gas and the cartridge part 230c for reactant gas, and even in a case that the source gas and the reactant gas simultaneously exist in the processing vessel, the air seal by the inert gas can surely function in each one of the cartridge parts 230b and 230c respectively. Therefore the source gas and the reactant gas are not mixed, thus not generating a vapor phase reaction. Further, the processing gas is supplied in the cartridge so as to be spread uniformly with a sufficient concentration, and the processing gas is supplied to an entire area of the surface of the wafer 200 by the relative movement of the wafer 200 and each one of the cartridge parts 230b and 230c. Therefore, uniform in-plane film formation rate is achieved without allowing a variation to occur in the concentration distribution of the processing gas supplied on the surface of the wafer 200.

(j) Further, according to the third embodiment, the lower surface 239 of the inert gas supply part 234 is disposed more closely to the wafer 200, than not only the lower surface 238 of the processing gas supply part 232, but also the lower surface of the processing gas exhaust part 236a. Therefore, in the processing space formed by the lower space of the processing gas supply part 232 and the lower space of the processing gas exhaust part 236a, the pressure of the processing gas which is supplied from the processing gas supply part 232 and stays in the processing space can be equalized, and the variation of the concentration distribution is suppressed, thus improving the in-plane uniformity of the film thickness of the thin film obtained by the film formation processing.

(k) Further, according to the third embodiment, the lower surface of the inert gas exhaust part 236b is disposed more closely to the wafer 200, than the lower surface of the processing gas exhaust part 236a. Therefore, the pressures of the lower space of the inert gas supply part 234 and the lower space of the inert gas exhaust part 236b can be easily higher, and further improvement of the sealing performance by the inert gas formed by the inert gas supply part 234, is achieved.

(l) Further, according to the third embodiment, the inert gas exhaust part 236b has a higher exhaust power than the processing gas exhaust part 236a, and the inert gas exhaust part 236b has a higher exhaust conductance than the processing gas exhaust part 236a, to thereby further improve the sealing performance of the air seal by the inert gas. Therefore, a fresh processing gas is prevented from being exhausted to outside of the cartridge, and the processing gas exposed to the wafer 200 and flowed to outside of the processing space, can be surely exhausted toward the upper side.

(m) Further, according to the third embodiment, the sealing performance of the air seal by the inert gas can be further improved by setting the gas pressure in the lower area of the inert gas supply part 234 to be higher than the gas pressure in the lower area of the processing gas supply part 232.

(n) Further, according to the third embodiment, the distance formed by flow of a reaction inhibiting substance generated by the reaction of the processing gas (source gas or reactant gas) on the wafer 200 can be small, thus preventing deposition of the reaction inhibiting substance on the wafer 200, by setting the separation distance between one processing gas exhaust part 236a and the other processing gas exhaust part 236a disposed at both sides of the processing gas supply part 232 to be smaller than the planer size of the wafer 200.

<Fourth Embodiment of the Present Invention>

A fourth embodiment of the present invention will be described next, with reference to the drawings. However, different points from the abovementioned first to third embodiments will be mainly described here, and explanation for the other point is omitted.

Figure 11:
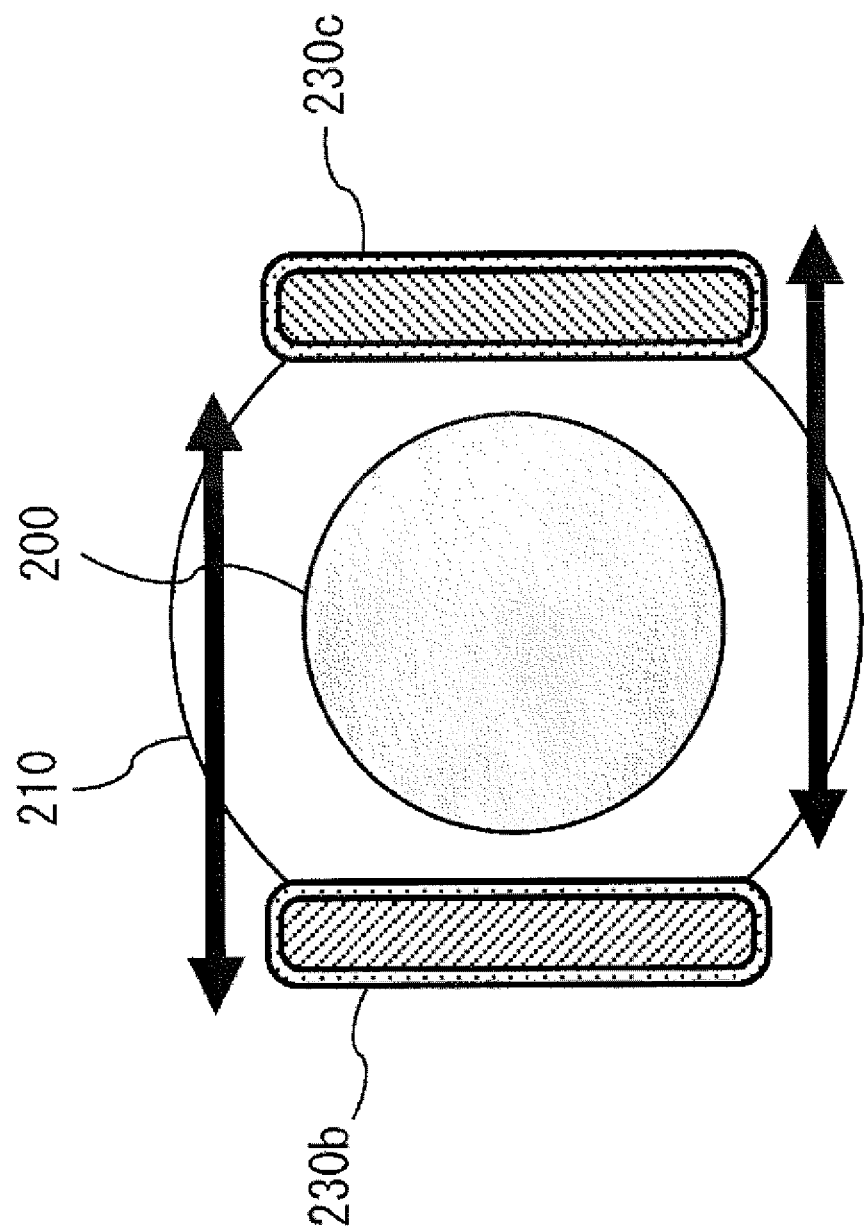
FIG. 11 is a conceptual view showing a schematic block diagram of an essential part of a substrate processing apparatus according to a fourth embodiment of the present invention.

(8) Structure of a Substrate Processing Apparatus according to a Fourth Embodiment FIG. 11 is a conceptual view showing a schematic constitutional example of an essential part of a substrate processing apparatus according to a fourth embodiment of the present invention.

(Basic Structure)

The substrate processing apparatus described in the fourth embodiment has a different structure from the structure of the abovementioned first embodiment, in the substrate mounting table 210, the cartridge head 230, and the moving mechanism.

The substrate mounting table 210 is configured to mount one wafer 200 on its upper surface (substrate mounting surface). The figure shows an example of forming the substrate mounting table 210 into a disc shape. However, the present invention is not particularly limited, and other shape maybe acceptable.

The cartridge head 230 is configured to include one cartridge part 230b for source gas and one cartridge part 230c for reactant gas. Then, each one of the cartridge parts 230b and 230c is not radially extended like the case of the first embodiment, but is disposed so that each longitudinal direction is extended in parallel. Each one of the cartridge part 230b, 230c itself may be constituted similarly to any one of the first to third embodiment.

The moving mechanism is configured to allow each one of the cartridge parts 230b and 230c to pass through the surface of the wafer 200 mounted on the substrate mounting table 210, by reciprocally moving each one of the cartridge parts 230b and 230c in parallel to the direction orthogonal to each longitudinal direction. Namely, the moving mechanism is configured to vary the relative position of the substrate mounting table 210, and each one of the cartridge parts 230b and 230c in the straight direction by reciprocally moving each one of the cartridge parts 230b and 230c in parallel. At this time, it can be considered that the moving mechanism alternately moves the cartridge part 230b for source gas and the cartridge part 230c for reactant gas, by moving one of them to pass through the surface of the wafer 200 after moving the other one to pass through the surface of the wafer 200. However, the present invention is not necessarily limited thereto, and each cartridge part may be synchronized and simultaneously moved in the same direction, so as to sequentially pass through the surface of the wafer 200. Further, the moving mechanism may vary the relative position of the substrate mounting table 210, and each one of the cartridge parts 230b and 230c in the straight direction by not moving the cartridge parts 230b and 230c respectively, but moving the substrate mounting table 210 on which the wafer 200 is mounted.

With this structure as well, a metal thin film is formed on the surface of the wafer 200 by sequential pass of the cartridge part 230b for source gas and the cartridge part 230c for reactant gas.

(Modified Example)

As described above, in a case of the structure that the relative position of the substrate mounting table 210, and the cartridge parts 230b and 230c is moved by the moving mechanism in the straight direction, there is no necessity for disposing the inert gas supply part 234 at both sides of the processing gas supply part 232, unlike the cases of the first to third embodiments.

Figure 12:
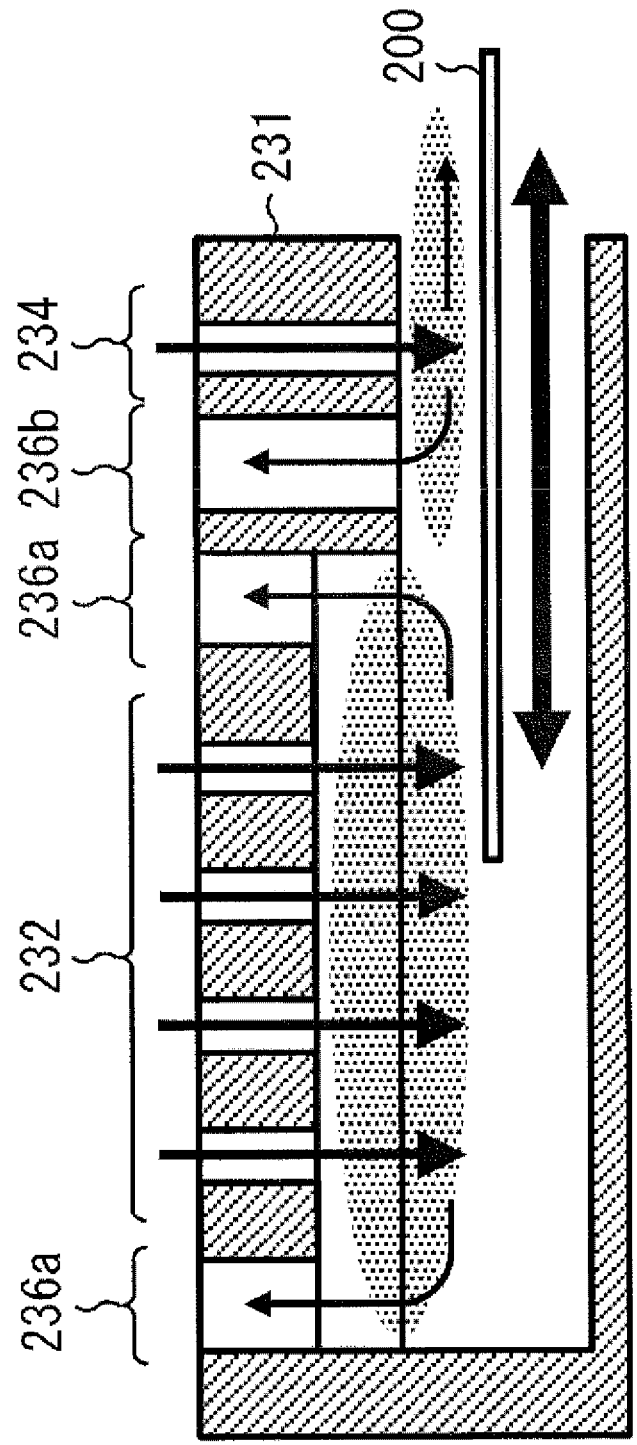
FIG. 12 is a cross-sectional view showing a detailed structure of a modified example of an essential part of a substrate processing apparatus according to a fourth embodiment of the present invention.

FIG. 12 is a cross-sectional view showing a detailed structure of a modified example of the essential part of the substrate processing apparatus according to the fourth embodiment of the present invention.

In the structure shown in the figure, the inert gas supply part 234 is disposed at only one side of the processing gas supply part 232 (specifically, at the side where the wafer 200 is inserted or extracted when varying the relative position). Even in such a structure, when one cartridge part 230b for source gas and one cartridge part 230c for reactant gas are provided and the relative position is varied in the straight direction, the source gas and the reactant gas can be separately supplied to the surface of the wafer 200 without being mixed.

(9) Effect of the Fourth Embodiment

According to the fourth embodiment, the following effect can be exhibited.

(o) According to the fourth embodiment, there are provided one cartridge part 230b for source gas and one cartridge part 230c for reactant gas extending in parallel to each other, and the relative position of these cartridge parts 230b and 230c, and the substrate mounting table 210 is moved by the moving mechanism in the straight direction. Accordingly, for example miniaturization of the substrate processing apparatus 100 and space saving, etc., of a setting space can be easily realized, compared with a case that the relative position of the substrate mounting table 210, and each one of the cartridge parts 230b and 230c is moved in the rotating direction.

<Fifth Embodiment of the Present Invention>

A fifth embodiment of the present invention will be described next, with reference to the drawings. However, different points from the abovementioned first to fourth embodiments will be mainly described here, and explanation for the other point is omitted.

(10) Structure of a Substrate Processing Apparatus according to a Fifth Embodiment A structure of a substrate processing apparatus described in a fifth embodiment is different from the structure of the abovementioned fourth embodiment, in a point that continuous film formation processing is applied to a plurality of wafers 200, by not reciprocally moving the relative position of the substrate mounting table 210, and each one of the cartridge parts 230 and 230c in the straight direction, but moving the relative position only in one direction.

Figure 13:
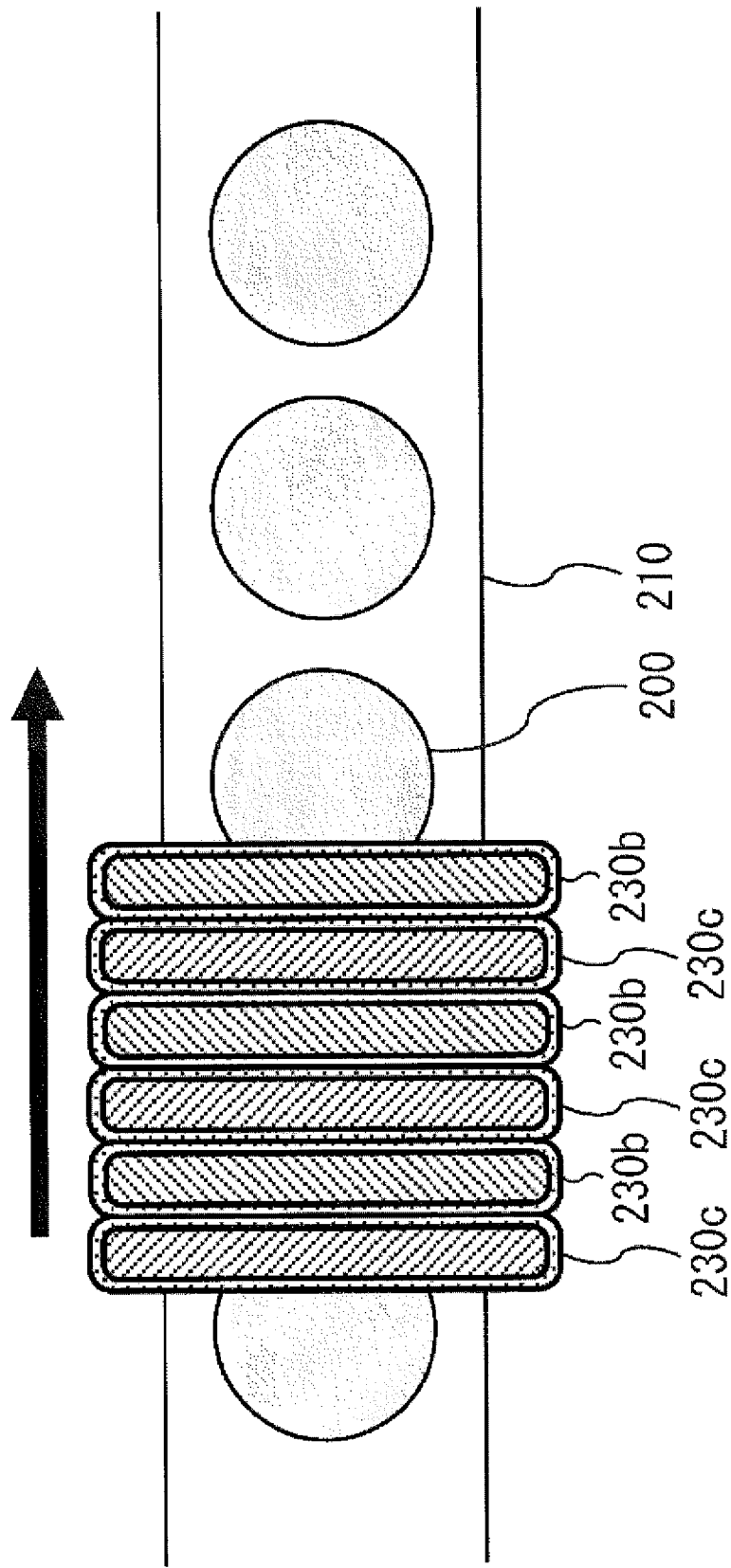
FIG. 13 is a conceptual view showing an example of a schematic structure of an essential part of a substrate processing apparatus according to a fifth embodiment of the present invention.

FIG. 13 is a conceptual view showing an example of a schematic structure of an essential part of a substrate processing apparatus according to a fifth embodiment of the present invention.

The substrate processing apparatus shown in the figure, is configured to dispose a plurality of wafers 200 so as to be arranged in one row on the substrate mounting table 210, in which the cartridge parts 230b for source gas and the cartridge parts 230c for reactant gas of the number corresponding to a repetition cycle number during film formation processing, are disposed so as to be alternately adjacent to each other. Then, the relative position of the substrate mounting table 210, and each one of the cartridge parts 230b and 230c is varied in the straight direction by moving the cartridge head in one direction so that each one of the cartridge parts 230b and 230c sequentially passes through the surface of each wafer 200 on the substrate mounting table 210.

According to the substrate processing apparatus with this structure, each one of the cartridge parts 230b and 230c sequentially passes through the surface of the wafer 200 on the substrate mounting table 210 by moving the cartridge head in one direction, and therefore the film formation processing can be continuously applied to each wafer 200.

Figure 14:
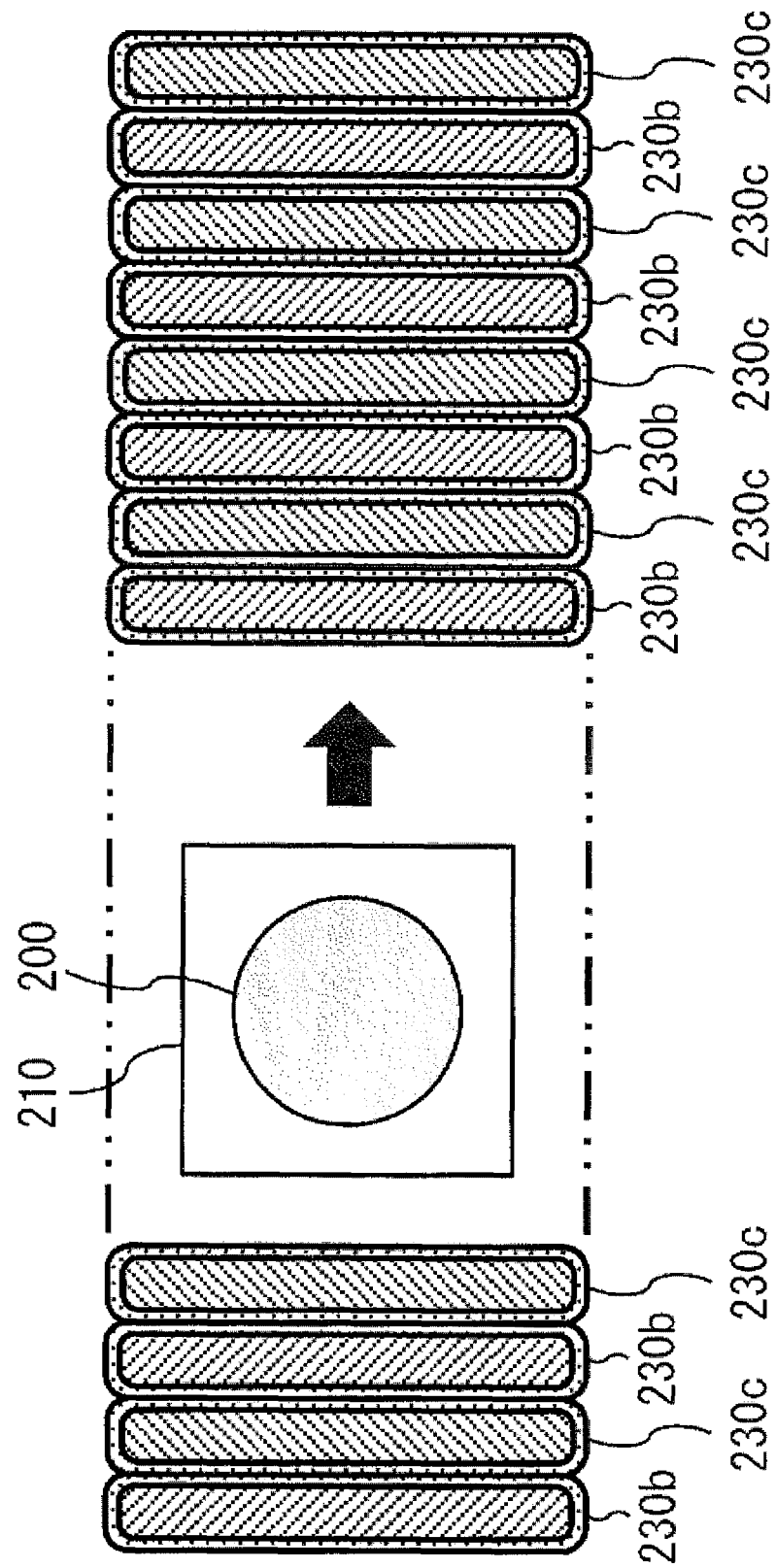
FIG. 14 is a conceptual view showing other example of a schematic structure of an essential part of a substrate processing apparatus according to a fifth embodiment of the present invention.

FIG. 14 is a conceptual view showing other example of a schematic structure of an essential part of the substrate processing apparatus according to the fifth embodiment of the present invention.

The substrate processing apparatus shown in the figure is configured to move not the cartridge head but the substrate mounting table 210. Namely, at least one wafer 200 is disposed on the substrate mounting table 210 which is movable in one direction. Further, the cartridge part 230b for source gas and the cartridge part 230c for reactant gas are arranged in one row so as to be alternately adjacent to each other. Then, the relative position of the substrate mounting table 210, and each one of the cartridge parts 230b and 230c is varied in the straight direction by moving the substrate mounting table 210 in one direction by the moving mechanism so that the substrate mounting table 210 on which the wafer 200 is mounted, sequentially passes through the lower space of each one of the cartridge parts 230b and 230c. Note that in each one of the cartridge parts 230b and 230c, both of them are not necessarily configured to supply a gas to the wafer 200, and only the cartridge parts 230b and 230c of the number corresponding to the repetition cycle number during film formation processing, are configured to supply a gas to the wafer 200.

According to the substrate processing apparatus with this structure, the wafer 200 on the substrate mounting table 210 sequentially passes through the lower space of each one of the cartridge parts 230b and 230c. Therefore, when a plurality of substrate mounting tables 210 are sequentially moved, film formation processing can be continuously applied to a plurality of wafers 200. In addition, by suitably adjusting the number of the cartridge parts 230b and 230c that supply a gas to the wafer 200, this substrate processing apparatus can suitably cope with any film thickness during film formation processing.

(11) Effect of the Fifth Embodiment

According to the fifth embodiment, the following effect can be exhibited.

(p) According to the fifth embodiment, a plurality of cartridge parts 230b and 230c are alternately adjacently arranged, so that the film formation processing can be continuously applied to a plurality of wafers 200. Accordingly, for example further improvement of the efficiency of film formation processing and high throughput can be realized compared with a case that the relative position of the substrate mounting table 210, and each one of the cartridges parts 230b and 230c, is moved in the rotating direction.

<Other Embodiment of the Present Invention>

As described above, the abovementioned each embodiment shows a case that the TiN film is formed on the wafer 200 by using $TiCl_4$ gas as the source gas (first processing gas), and using $NH_3$ gas as the reactant gas (second processing gas), and alternately supplying these gases. However, the present invention is not limited thereto. Namely, the processing gas used for the film formation processing is not limited to $TiCl_4$ gas and $NH_3$ gas, etc., and other kind of gas may be used to form other kind of thin film. Further, even in a case of using three kinds or more of processing gas, the present invention can be applied if these gases are alternately supplied during formation processing.

Further for example, the abovementioned embodiment shows a case that the film formation processing is given as the processing performed by the substrate processing apparatus. However, the present invention is not limited thereto. Namely, processing of forming an oxide film and a nitride film, or processing of forming a film containing metal, may be acceptable other than the film formation processing. Further, a specific content of substrate processing is not particularly limited, and the present invention can be suitably applied to not only the film formation processing but also other substrate processing such as annealing, oxidation, nitriding, dispersion, and lithography, etc. Further, the present invention can also be applied to other substrate processing apparatus such as an annealing processing apparatus, an oxidation processing apparatus, a nitriding processing apparatus, an exposure apparatus, a coater, a dryer, a heater, and a processing apparatus using plasma, etc. Also, these apparatuses may coexist in the present invention. Further, a part of a certain embodiment structure may be replaced with other embodiment structure, or a certain embodiment structure may be added to other embodiment structure. Further, addition, deletion, replacement of other structure may be acceptable in a part of each embodiment structure.

<Preferred Aspect of the Present Invention>

Preferred aspects of the present invention will be supplementarily described hereafter.

[Supplementary Description 1]

According to an aspect of the present invention, there is provided a substrate processing apparatus, including:

a substrate mounting table on which a substrate is mounted;

a processing gas supply part configured to supply a processing gas on a surface of the substrate from an upper side of the substrate mounting table;

an inert gas supply part configured to supply an inert gas on a surface of the substrate from an upper side of the substrate mounting table at a lateral side of the processing gas supply part; and a plurality of gas exhaust parts configured to exhaust the gas supplied on the surface of the substrate to an upper side, between the processing gas supply part and the inert gas supply part.

[Supplementary Description 2]

Preferably, there is provided the substrate processing apparatus according to supplementary description 1, wherein the plurality of gas exhaust parts include:

a first gas exhaust part disposed more closely to the processing gas supply part than the inert gas supply part, between the processing gas supply part and the inert gas supply part; and a second gas exhaust part disposed more closely to the inert gas supply part than the processing gas supply part, between the processing gas supply part and the inert gas supply part.

[Supplementary Description 3]

Preferably, there is provided the substrate processing apparatus according to supplementary description 1 or 2, wherein inert gas supply part is disposed at both sides of the processing gas supply part, and the plurality of gas exhaust parts are provided between the processing gas supply part and the inert gas supply part at one side, and between the processing gas supply part and the inert gas supply part at other side.

[Supplementary Description 4]

Preferably, there is provided the substrate processing apparatus according to any one of supplementary descriptions 1 to 3, including:

a cartridge part configured to have the processing gas supply part, the inert gas supply part, and the plurality of gas exhaust parts; and a moving mechanism of varying a relative position of the substrate mounting table and the cartridge part.

[Supplementary Description 5]

Preferably, there is provided the substrate processing apparatus according to supplementary description 4, including the plurality of radially disposed cartridge parts, wherein the moving mechanism is configured to vary the relative position of the substrate mounting table and the cartridge part in a rotating direction with a center of the radial shape as a rotation axis, and the substrate mounting table is configured to mount the plurality of substrates thereon along the rotating direction.

[Supplementary Description 6]

Preferably, there is provided the substrate processing apparatus according to any one of the supplementary descriptions 1 to 5, including the plurality of cartridge parts, so that a different kind of processing gas is supplied by each different kind of processing gas supply part of each cartridge part.

[Supplementary Description 7]

Preferably, there is provided the substrate processing apparatus according to any one of the supplementary descriptions 1 to 6, wherein a lower surface of the inert gas supply part is more closely to the substrate than a lower surface of the processing gas supply part.

[Supplementary Description 8]

Preferably, there is provided the substrate processing apparatus according to supplementary description 7, wherein the lower surface of the inert gas supply part is disposed more closely to the substrate than the lower surface of the gas exhaust part of the plurality of gas exhaust parts disposed more closely to the processing gas supply part than the inert gas supply part between the processing gas supply part and the inert gas supply part.

[Supplementary Description 9]

Preferably, there is provided the substrate processing apparatus according to supplementary description 7 or 8, wherein the lower surface of a gas exhaust part of the plurality of gas exhaust parts disposed more closely to the inert gas supply part than the processing gas supply part between the processing gas supply part and the inert gas supply part, is disposed more closely to the substrate than the lower surface of a gas exhaust part of the plurality of gas exhaust parts disposed more closely to the processing gas supply part than the inert gas supply part between the processing gas supply part and the inert gas supply part.

[Supplementary Description 10]

Preferably, there is provided the substrate processing apparatus according to any one of supplementary descriptions 1 to 9, wherein a gas exhaust part of the plurality of gas exhaust parts disposed more closely to the inert gas supply part than the processing gas supply part between the processing gas supply part and the inert gas supply part, has a higher exhaust power than a gas exhaust part of the plurality of gas exhaust parts disposed more closely to the processing gas supply part than the inert gas supply part between the processing gas supply part and the inert gas supply part.

[Supplementary Description 11]

Preferably, there is provided the substrate processing apparatus according to any one of supplementary descriptions 1 to 10, wherein a gas exhaust part of the plurality of gas exhaust parts disposed more closely to the inert gas supply part than the processing gas supply part between the processing gas supply part and the inert gas supply part, has a higher exhaust conductance than a gas exhaust part of the plurality of gas exhaust parts disposed more closely to the processing gas supply part than the inert gas supply part between the processing gas supply part and the inert gas supply part.

[Supplementary Description 12]

Preferably, there is provided the substrate processing apparatus according to any one of supplementary descriptions 1 to 11, wherein a gas pressure in a lower area of the inert gas supply part is higher than a gas pressure in a lower area of the processing gas supply part.

[Supplementary Description 13]

Preferably, there is provided the substrate processing apparatus according to any one of supplementary descriptions 1 to 12, wherein one of the plurality of gas exhaust parts disposed more closely to the processing gas supply part than the inert gas supply part, is disposed at both sides of the processing gas supply part with the processing gas supply part interposed between them, and a separation distance between the one of the gas exhaust parts and the other gas exhaust part at both sides is smaller than a planar size of the substrate.

[Supplementary Description 14]

According to other aspect of the present invention, there is provided a substrate processing apparatus, including:

a substrate mounting table on which a substrate is mounted;

a processing gas supply part configured to supply a processing gas on a surface of the substrate from an upper side of the substrate mounting table;

an inert gas supply part configured to supply an inert gas on a surface of the substrate from an upper side of the substrate mounting table at a lateral side of the processing gas supply part; and a gas exhaust part configured to exhaust a gas supplied on the surface of the substrate to an upper side, between the processing gas supply part and the inert gas supply part, wherein a lower surface of the inert gas supply part is disposed more closely to the substrate than a lower surface of the processing gas supply part.

[Supplementary Description 15]

According to other aspect of the present invention, there is provided a method for manufacturing a semiconductor device, including:

supplying a processing gas on a surface of a substrate mounted on a substrate mounting table from a processing gas supply part positioned at an upper side of the substrate mounting table;

supplying an inert gas on the surface of the substrate from an inert gas supply part disposed at a lateral side of the processing gas supply part and positioned at the upper side of the substrate mounting table;

exhausting a processing gas supplied on the surface of the substrate to the upper side of the substrate by at least a part of the plurality of gas exhaust parts disposed between the processing gas supply part and the inert gas supply part; and exhausting an inert gas supplied on the surface of the substrate by at least other part of the plurality of gas exhaust parts.

[Supplementary Description 16]

According to other aspect of the present invention, there is provided a program for causing a computer to execute in parallel:

a processing gas supply procedure of supplying a processing gas on a surface of a substrate mounted on a substrate mounting table from a processing gas supply part positioned at an upper side of the substrate mounting table;

an inert gas supply procedure of supplying an inert gas on the surface of the substrate from an inert gas supply part disposed at a lateral side of the processing gas supply part and positioned at the upper side of the substrate mounting table;

a processing gas exhaust procedure of exhausting a processing gas supplied on the surface of the substrate to the upper side of the substrate by at least a part of the plurality of gas exhaust parts disposed between the processing gas supply part and the inert gas supply part; and an inert gas exhaust procedure of exhausting an inert gas supplied on the surface of the substrate by at least other part of the plurality of gas exhaust parts.

[Supplementary Description 17]

According to other aspect of the present invention, there is provided a non-transitory computer readable recording medium storing a program for causing a computer to execute in parallel:

a processing gas supply procedure of supplying a processing gas on a surface of a substrate mounted on a substrate mounting table from a processing gas supply part positioned at an upper side of the substrate mounting table;

an inert gas supply procedure of supplying an inert gas on the surface of the substrate from an inert gas supply part disposed at a lateral side of the processing gas supply part and positioned at the upper side of the substrate mounting table;

a processing gas exhaust procedure of exhausting a processing gas supplied on the surface of the substrate to the upper side of the substrate by at least a part of the plurality of gas exhaust parts disposed between the processing gas supply part and the inert gas supply part; and an inert gas exhaust procedure of exhausting an inert gas supplied on the surface of the substrate by at least other part of the plurality of gas exhaust parts.

What is claimed is:

1. A substrate processing apparatus, comprising:
a substrate mounting table on which a substrate is mounted;
a processing gas supply part configured to supply a processing gas on a surface of the substrate from an upper side of the substrate mounting table;
an inert gas supply part configured to supply an inert gas on the surface of the substrate from an upper side of the substrate mounting table at a lateral side of the processing gas supply part, and configured so that a lower surface of the inert gas supply part is more closely to the substrate than a lower surface of the processing gas supply part; and a plurality of gas exhaust parts configured to exhaust the gas supplied on the surface of the substrate to an upper side of the substrate, between the processing gas supply part and the inert gas supply part.

2. The substrate processing apparatus according to claim 1, wherein the plurality of gas exhaust parts comprises:

a first gas exhaust part disposed more closely to the processing gas supply part than the inert gas supply part, between the processing gas supply part and the inert gas supply part; and a second gas exhaust part disposed more closely to the inert gas supply part than the processing gas supply part, between the processing gas supply part and the inert gas supply part.

3. The substrate processing apparatus according to claim 1, wherein the inert gas supply part is disposed at both sides of the processing gas supply part, and the plurality of gas exhaust parts are provided between the processing gas supply part and the inert gas supply part at one side, and between the processing gas supply part and the inert gas supply part at other side.

4. The substrate processing apparatus according to claim 1, comprising:

a cartridge part configured to have the processing gas supply part, the inert gas supply part, and the plurality of gas exhaust parts; and a moving mechanism of varying a relative position of the substrate mounting table and the cartridge part.

5. The substrate processing apparatus according to claim 1, wherein the lower surface of the inert gas supply part is disposed more closely to the substrate than the lower surface of the gas exhaust part of the plurality of gas exhaust parts, which is disposed more closely to the processing gas supply part than the inert gas supply part between the processing gas supply part and the inert gas supply part.

6. The substrate processing apparatus according to claim 1, wherein the lower surface of a gas exhaust part of the plurality of gas exhaust parts, which is disposed more closely to the inert gas supply part than the processing gas supply part between the processing gas supply part and the inert gas supply part, is disposed more closely to the substrate than the lower surface of a gas exhaust part of the plurality of gas exhaust parts, and which is disposed more closely to the processing gas supply part than the inert gas supply part between the processing gas supply part and the inert gas supply part.

7. The substrate processing apparatus according to claim 1, wherein a gas exhaust part of the plurality of gas exhaust parts, which is disposed more closely to the inert gas supply part than the processing gas supply part between the processing gas supply part and the inert gas supply part, has a higher exhaust power than a gas exhaust part of the plurality of gas exhaust parts, and which is disposed more closely to the processing gas supply part than the inert gas supply part between the processing gas supply part and the inert gas supply part.

8. The substrate processing apparatus according to claim 1, wherein a gas exhaust part of the plurality of gas exhaust parts, which is disposed more closely to the inert gas supply part than the processing gas supply part between the processing gas supply part and the inert gas supply part, has a higher exhaust conductance than a gas exhaust part of the plurality of gas exhaust parts, and which is disposed more closely to the processing gas supply part than the inert gas supply part between the processing gas supply part and the inert gas supply part.

9. The substrate processing apparatus according to claim 1, wherein a gas pressure in a lower area of the inert gas supply part is higher than a gas pressure in a lower area of the processing gas supply part.

10. The substrate processing apparatus according to claim 1, wherein one of the plurality of gas exhaust parts disposed more closely to the processing gas supply part than the inert gas supply part, is disposed at both sides of the processing gas supply part with the processing gas supply part interposed between them, and a separation distance between the one of the gas exhaust parts and the other gas exhaust part at both sides is smaller than a planar size of the substrate.

11. The substrate processing apparatus according to claim 1, wherein the inert gas supply part is configured to supply the inert gas on the surface of the substrate from the upper side of the substrate mounting table at both sides of the processing gas supply part, and configured so that the lower surface is disposed more closely to the substrate than the lower surface of the processing gas supply part; and the plurality of gas exhaust parts comprises:

a first gas exhaust part configured to exhaust the processing gas supplied on the surface of the substrate to the upper side of the substrate, at both sides of the processing gas supply part, and a second gas exhaust part configured to exhaust the inert gas supplied on the surface of the substrate to the upper side of the substrate, between the first gas exhaust part and the inert gas supply part, and configured to have a higher exhaust conductance than the first gas exhaust part.

12. The substrate processing apparatus according to claim 1, further comprising:

a first pressure control unit that is connected to the first gas exhaust part, and controls the exhaust of the processing gas; and a second pressure control unit that is connected to the second gas exhaust part, and controls the exhaust of the inert gas.

13. The substrate processing apparatus according to claim 4, comprising the plurality of radially disposed cartridge parts, wherein the moving mechanism is configured to vary the relative position of the substrate mounting table and the cartridge part in a rotating direction with a center of the radial shape as a rotation axis, and the substrate mounting table is configured to mount the plurality of substrates thereon along the rotating direction.

14. The substrate processing apparatus according to claim 4, comprising the plurality of cartridge parts, and configured so that a different kind of processing gas is supplied by the processing gas supply part of each of the cartridge parts.

15. A method for manufacturing a semiconductor device, comprising:

supplying a processing gas on a surface of a substrate mounted on a substrate mounting table from a processing gas supply part positioned at an upper side of the substrate mounting table;

supplying an inert gas on the surface of the substrate from an inert gas supply part disposed at a lateral side of the processing gas supply part and positioned at the upper side of the substrate mounting table, configured so that a lower surface of the inert gas supply part is more closely to the substrate than a lower surface of the processing gas supply part;

exhausting the processing gas supplied on the surface of the substrate to the upper side of the substrate by at least a part of a plurality of gas exhaust parts disposed between the processing gas supply part and the inert gas supply part; and exhausting the inert gas supplied on the surface of the substrate by at least other part of the plurality of gas exhaust parts, which are executed in parallel.

16. The method for manufacturing a semiconductor device according to claim 15, wherein in the supply of the inert gas, the inert gas is supplied on the surface of the substrate from the inert gas supply part disposed at both sides of the processing gas supply part, positioned at the upper side of the substrate mounting table, and the lower surface of which is disposed more closely to the substrate than the lower surface of the processing gas supply part, in the exhaust of the processing gas, exhausting the processing gas supplied on the surface of the substrate to the upper side of the substrate by a first gas exhaust part disposed at both sides of the processing gas supply part, and controlling the exhaust of the processing gas by a first pressure control unit connected to the first gas exhaust part, are executed in parallel, and in the exhaust of the inert gas, exhausting the inert gas supplied on the surface of the substrate to the upper side of the substrate by a second gas exhaust part disposed between the first gas exhaust part and the inert gas supply part, and having a higher exhaust conductance than the first exhaust part, and controlling the exhaust of the inert gas by a second pressure control unit connected to the second gas exhaust part, are executed in parallel.

17. A non-transitory computer readable recording medium storing a program for causing a computer to execute in parallel:

supplying a processing gas on a surface of a substrate mounted on a substrate mounting table from a processing gas supply part positioned at an upper side of the substrate mounting table;

supplying an inert gas on the surface of the substrate from an inert gas supply part disposed at a lateral side of the processing gas supply part and positioned at the upper side of the substrate mounting table, and configured so that a lower surface of the inert gas supply part is more closely to the substrate than a lower surface of the processing gas supply part;

exhausting the processing gas supplied on the surface of the substrate to the upper side of the substrate by at least a part of a plurality of gas exhaust parts disposed between the processing gas supply part and the inert gas supply part; and exhausting the inert gas supplied on the surface of the substrate by at least other part of the plurality of gas exhaust parts.

18. The non-transitory computer readable recording medium according to claim 17, which stores the program:

in the supply of the inert gas, for causing the computer to execute:

supplying the inert gas on the surface of the substrate from the inert gas supply part disposed at both sides of the processing gas supply part, positioned at the upper side of the substrate mounting table, and the lower surface of which is more closely to the substrate than the lower surface of the processing gas supply part, in the exhaust of the processing gas, for causing the computer to execute in parallel:

exhausting the processing gas supplied on the surface of the substrate to the upper side of the substrate by a first gas exhaust part disposed at both sides of the processing gas supply part, and controlling the exhaust of the processing gas by a first pressure control unit connected to the first gas exhaust part, and in the exhaust of the inert gas, for causing the computer to execute in parallel:

exhausting the inert gas supplied on the surface of the substrate to the upper side of the substrate by a second gas exhaust part disposed between the first gas exhaust part and the inert gas supply part, and having a higher exhaust conductance than the first exhaust part, and controlling the exhaust of the inert gas by a second pressure control unit connected to the second gas exhaust part.

* * * * *